United States Patent
Kurokawa et al.

(10) Patent No.: US 10,084,447 B2
(45) Date of Patent: Sep. 25, 2018

(54) SEMICONDUCTOR DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Yoshiyuki Kurokawa, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/374,059

(22) Filed: Dec. 9, 2016

(65) Prior Publication Data

US 2017/0093394 A1    Mar. 30, 2017

Related U.S. Application Data

(63) Continuation of application No. 14/818,588, filed on Aug. 5, 2015, now Pat. No. 9,520,873.

(30) Foreign Application Priority Data

Aug. 8, 2014   (JP) .................................. 2014-162476

(51) Int. Cl.
*H03K 17/68* (2006.01)
*H03K 17/687* (2006.01)
(Continued)

(52) U.S. Cl.
CPC ....... *H03K 17/687* (2013.01); *H01L 27/0688* (2013.01); *H01L 29/7869* (2013.01)

(58) Field of Classification Search
CPC .. H03K 17/687; H03K 3/0315; H03K 17/163; H03K 3/356; H03K 5/08;
(Continued)

(56) References Cited

U.S. PATENT DOCUMENTS 5,581,692 A    12/1996   Nevitt et al.
5,731,856 A     3/1998   Kim et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — John Poos
(74) *Attorney, Agent, or Firm* — Nixon Peabody LLP; Jeffrey L. Costellia

(57) ABSTRACT

A semiconductor device having excellent data retention characteristics. A transistor with a low off-state current is utilized to save and retain data stored in a memory circuit, and a potential to be applied to a back gate of the transistor is applied from a battery provided for each memory circuit. The potential applied to the back gate of the transistor and a potential for charging the battery are generated in a voltage generation circuit. The battery is charged utilizing power gating of the memory circuit and data retention characteristics is improved.

15 Claims, 22 Drawing Sheets

(51) Int. Cl.
 *H01L 27/06* (2006.01)
 *H01L 29/786* (2006.01)

(58) Field of Classification Search
 CPC ............ H03K 17/06; H03K 5/07; H03K 5/26;
  H03K 7/08
 USPC .......................... 327/108, 109, 110, 111, 112
 See application file for complete search history.

(56) References Cited

U.S. PATENT DOCUMENTS

| | | |
|---|---|---|
| 5,744,864 A | 4/1998 | Cillessen et al. |
| 6,141,259 A | 10/2000 | Scott et al. |
| 6,294,274 B1 | 9/2001 | Kawazoe et al. |
| 6,563,174 B2 | 5/2003 | Kawasaki et al. |
| 6,603,295 B2 * | 8/2003 | Reithmaier ............. G05F 1/565 323/313 |
| 6,727,522 B1 | 4/2004 | Kawasaki et al. |
| 6,788,130 B2 * | 9/2004 | Pauletti ................. H02M 3/073 327/536 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0187410 A1 | 8/2011 | Kato et al. |
| 2012/0049905 A1 * | 3/2012 | Takahashi ................. G05F 3/30 327/142 |
| 2012/0075939 A1 | 3/2012 | Sampigethaya et al. |
| 2012/0314524 A1 | 12/2012 | Takemura |
| 2013/0234757 A1 | 9/2013 | Kato et al. |
| 2013/0300462 A1 | 11/2013 | Koyama et al. |
| 2015/0200657 A1 | 7/2015 | Kato et al. |
| 2015/0249439 A1 | 9/2015 | Kozuma et al. |
| 2016/0043070 A1 | 2/2016 | Momo et al. |
| 2016/0043715 A1 | 2/2016 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-007386 A | 1/2014 |
| WO | WO-2004/114391 | 12/2004 |
| WO | WO-2015/121771 | 8/2015 |
| WO | WO-2016/020802 | 2/2016 |

OTHER PUBLICATIONS

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

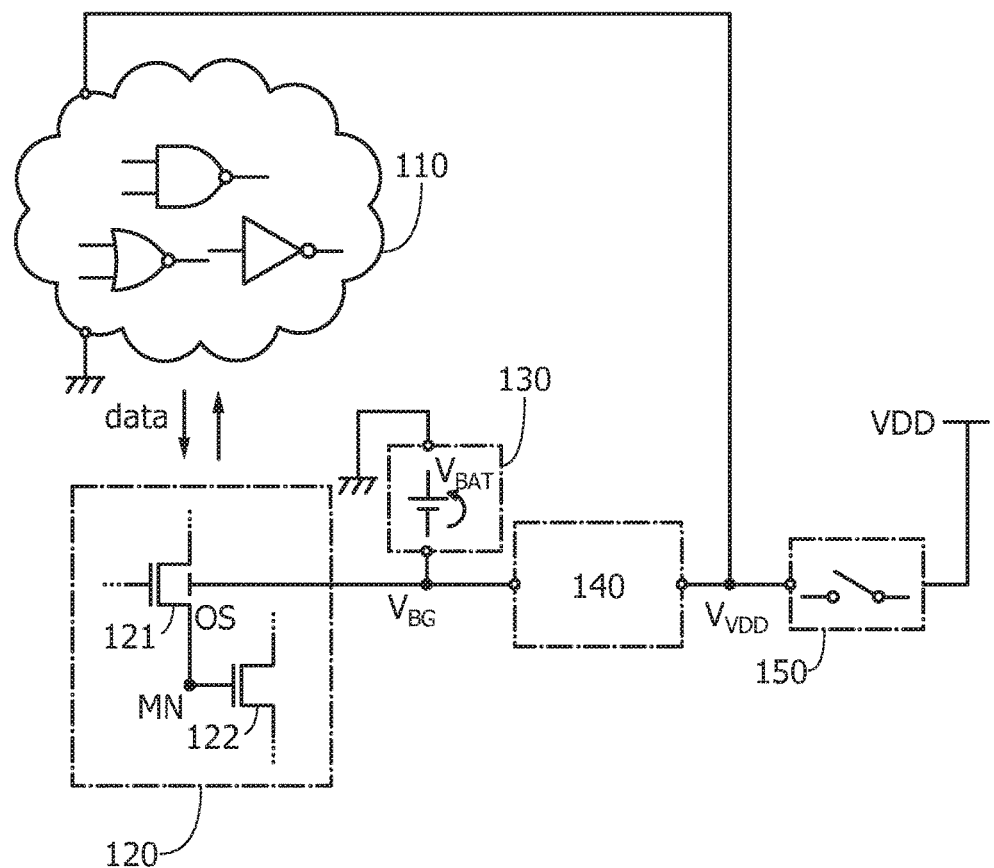

1000

740A

740A

740C

740C

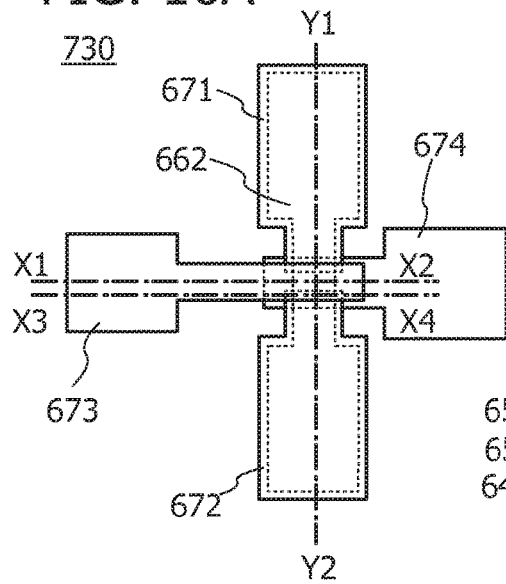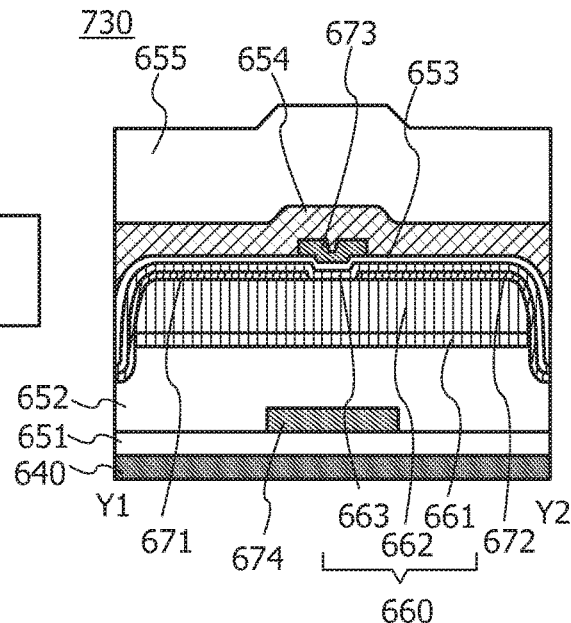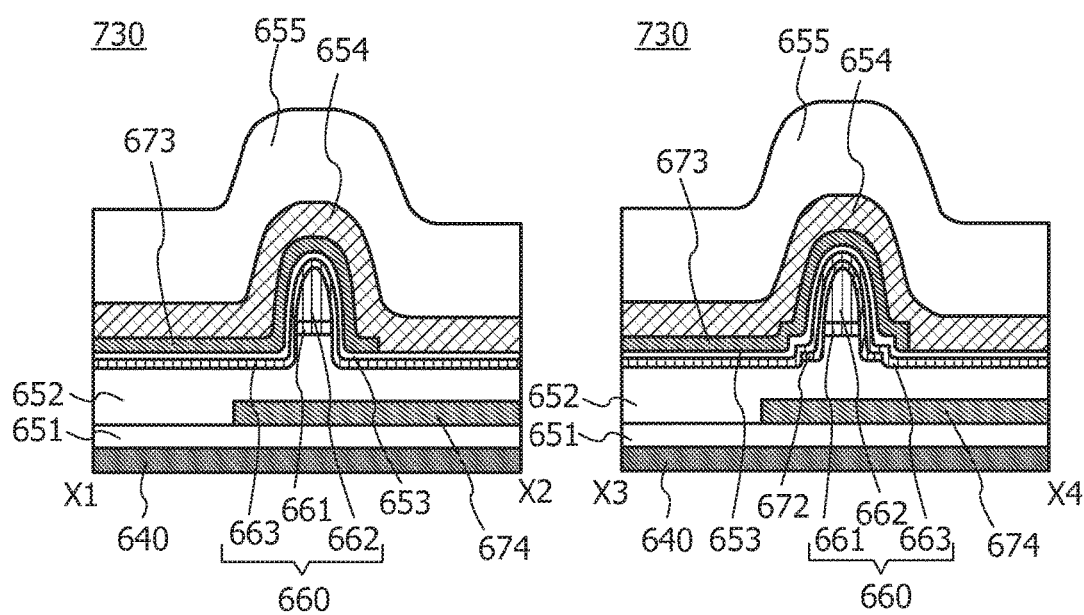

FIG. 18A
FIG. 18B
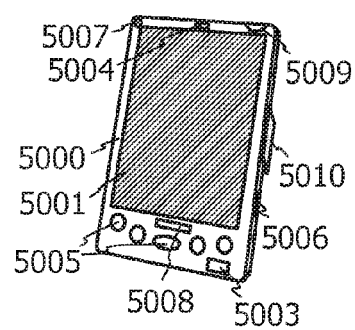
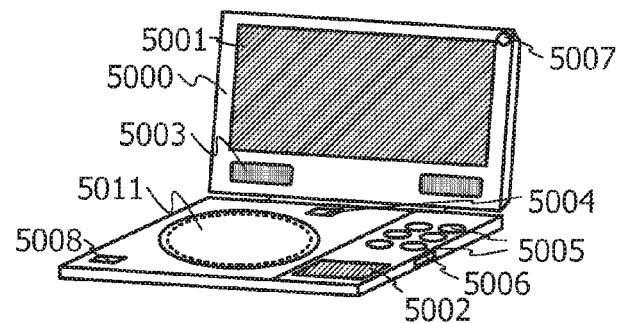
FIG. 18C
FIG. 18D
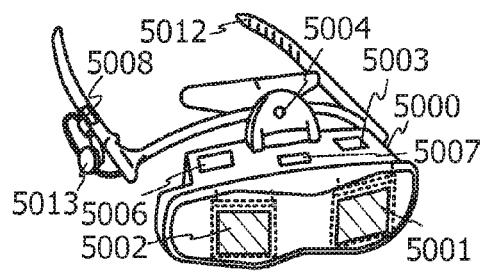
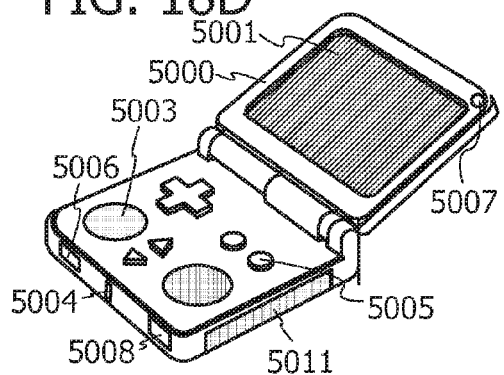
FIG. 18E
FIG. 18F
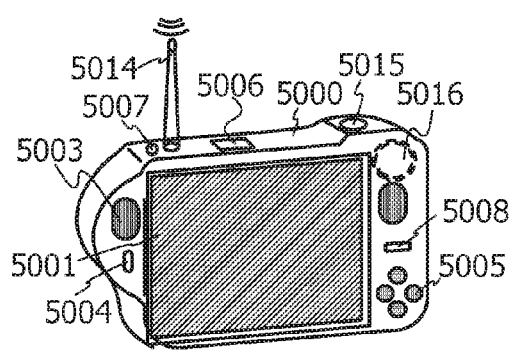
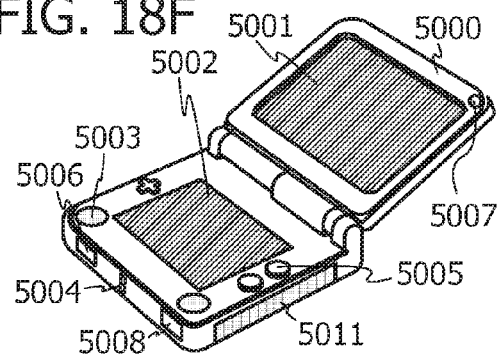

5101  5103  5102  5100

5201
5203
5202
5200

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

Patent Document 1 discloses a configuration in which a potential for controlling a threshold voltage is periodically applied to a back gate of a transistor.

PATENT DOCUMENT

Japanese Published Patent Application No. 2014-007386

SUMMARY OF THE INVENTION

In a configuration in which a potential is externally applied to a back gate, the potential applied to a back gate needs to be periodically set using another transistor. Accordingly, the potential applied to the back gate of a transistor fails to be constant, which might lead to insufficient data retention characteristics.

An object of one embodiment of the present invention is to provide a novel semiconductor device, a novel electronic device, or the like.

Another object of one embodiment of the present invention is to provide a semiconductor device or the like that has a novel structure and excellent data retention characteristics. Another object of one embodiment of the present invention is to provide a semiconductor device or the like having a novel structure in which a potential applied to a back gate of a transistor can be constant.

Note that objects of one embodiment of the present invention are not limited to the aforementioned objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device comprising a first circuit, a second circuit, a battery, a voltage generation circuit, and a switch. The first circuit has a function of retaining data. A first potential and a second potential are applied to the first circuit. The second circuit comprises a first transistor and a second transistor. The first transistor comprises a first gate and a second gate. A gate of the second transistor is electrically connected to one of a source and a drain of the first transistor. The second circuit has a function of holding charge corresponding to the data in a node connecting the gate of the second transistor and the one of the source and the drain of the first transistor. The switch has a function of controlling a state of conduction between the first circuit and a wiring through which the first potential is applied. The battery comprises a first terminal and a second terminal. The first terminal of the battery is electrically connected to a wiring through which the second potential is applied. A potential of the first terminal of the battery is higher than a potential of the second terminal. The voltage generation circuit has a function of generating a third potential lower than the second potential. The second gate of the first transistor is electrically connected to the second terminal of the battery. The third potential is applied to the second gate and the second terminal of the battery.

In the semiconductor device of the embodiment of the present invention, preferably, the voltage generation circuit is configured to generate the third potential by turning off the switch and releasing charge accumulated in the first circuit.

In the semiconductor device of the embodiment of the present invention, preferably, the voltage generation circuit is configured to generate the third potential by intermittently applying the first potential.

In the semiconductor device of the embodiment of the present invention, preferably, the first circuit is a latch circuit.

In the semiconductor device of the embodiment of the present invention, preferably, the first transistor comprises an oxide semiconductor in a semiconductor layer.

In the semiconductor device of the embodiment of the present invention, preferably, the battery comprises a solid electrolyte.

Note that other embodiments of the present invention will be described in the following embodiments with reference to the drawings.

According to one embodiment of the present invention, a novel semiconductor device, a novel electronic device, or the like can be provided.

According to one embodiment of the present invention, a semiconductor device or the like that has a novel structure and excellent data retention characteristics can be provided. According to one embodiment of the present invention, a semiconductor device or the like having a novel structure in which a potential applied to a back gate of a transistor can be constant can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIG. 1 is a block diagram illustrating one embodiment of the present invention;

FIGS. 16A to 16D are a top view and cross-sectional views illustrating one embodiment of the present invention;

FIGS. 18A to 18F each illustrate one embodiment of the present invention;

DETAILED DESCRIPTION OF THE INVENTION

Figure 2A:
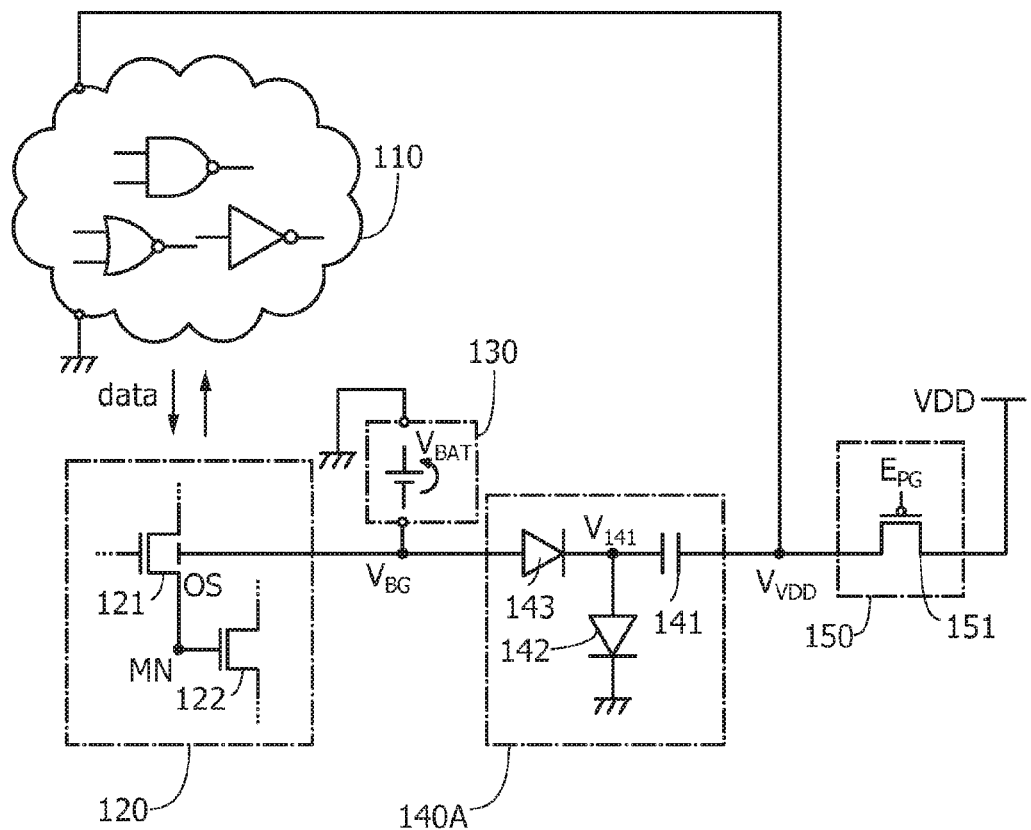
FIGS. 2A and 2B are a circuit diagram and a timing chart illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. Instead, one of the source and the drain might be referred to as a first electrode, and the other of the source and the drain might be referred to as a second electrode.

Note that in this specification, ordinal numbers such as "first", "second", and "third" are used in order to avoid confusion among components, and the terms do not limit the components numerically.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these examples. Here, X, Y, Z1, and Z2 each denote an object (e.g., a device, an element, a circuit, a wiring, an electrode, a terminal, a conductive film, and a layer).

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, the positional relation can be described in different ways as appropriate depending on the situation, without being limited to the term used in this specification.

The positional relation of circuit blocks in a block diagram is specified for description. Even when a block diagram shows that different functions are achieved by different circuit blocks, one circuit block may be actually configured to achieve the different functions. Functions of circuit blocks in a diagram are specified for description, and even when a diagram shows one circuit block performing given processing, a plurality of circuit blocks may be actually provided to perform the processing.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

A configuration of a semiconductor device of one embodiment of the present invention is described with reference to FIG. 1.

In this specification and the like, the term "semiconductor device" refers to all devices that can operate by utilizing semiconductor characteristics. Furthermore, the term "semiconductor device" refers to a circuit utilizing semiconductor characteristics or the whole of a system that includes the circuit.

FIG. 1 is a block diagram showing the configuration of a semiconductor device of one embodiment of the present invention.

In FIG. 1, a semiconductor device 100 includes a circuit 110, a circuit 120, a battery 130, a voltage generation circuit 140, and a switch 150. The circuit 120 includes a transistor 121 and a transistor 122.

In one embodiment of the present invention, the transistor 121 with a low off-state current in the circuit 120 is utilized to save and retain data stored in the circuit 110, and a potential to be applied to a back gate of the transistor 121 is applied from the battery 130 corresponding to the circuit 110. In one embodiment of the present invention, the potential to be applied to the back gate of the transistor 121 and a potential for charging the battery 130 are generated in the voltage generation circuit 140. Using power gating of the semiconductor device 100 by the switch 150, the potential is generated in the voltage generation circuit 140 and the battery is charged.

The potential to be applied to the back gate of the transistor 121 in the circuit 120 for saving and retaining the data stored in the circuit 110 is applied from the battery 130. The battery 130 can continue to keep the potential of the back gate of the transistor 121 constant; accordingly, a change in potential can be kept small. In addition, with the potential of the back gate of the transistor 121, a threshold voltage of the transistor can be kept high. Thus, the circuit 120 can have excellent data retention characteristics.

Next, components of the semiconductor device 100 are described.

The circuit 110 has a function of retaining data (denoted by data). The circuit 110 is formed using a combinational circuit and/or a sequential circuit. Specific examples of the circuit 110 includes large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). The circuit 110 may be referred to as an integrated circuit, a logic circuit, a memory circuit, a latch circuit, a flip flop, or a register. The circuit 110 may be referred to as a first circuit.

Whether to supply a power supply voltage to the circuit 110 is controlled by power gating. In FIG. 1, as potentials for the supply of a power supply voltage, for example, a potential $V_{VDD}$ and a potential VSS1 are applied. The potential $V_{VDD}$ is a potential configured to change to a potential VDD or the potential VSS1. The potential $V_{VDD}$ changes to the potential VDD or the potential VSS1 in accordance with the on/off state of the switch 150. For example, when the switch 150 is on and the potential $V_{VDD}$ is the potential VDD, a power supply voltage is supplied to the circuit 110. When the switch 150 is off and charge is released, the potential $V_{VDD}$ changes from the potential VDD to the potential VSS1, the supply of a power supply voltage is stopped.

The potential $V_{VDD}$ corresponds to the potential of a wiring for electrical connection between the switch 150 and the circuit 110. The potential VDD is higher than the potential VSS1. The potential VSS1 is lower than the potential VDD, for example, a ground potential GND, as illustrated in FIG. 1.

The circuit 120 has a function of retaining data during a period in which the supply of a power supply voltage to the circuit 110 is stopped. As in the case of the circuit 110, whether to supply a power supply voltage to the circuit 120 is controlled by power gating. FIG. 1 specifically illustrates the circuit including the transistor 121 and the transistor 122 in which data can be retained even when the supply of a power supply voltage is stopped. An exchange between the circuit 110 and the circuit 120 (saving or restoring data data) is controlled by a control signal that is additionally input. The circuit 120 may be referred to as a second circuit.

In the configuration in which data is retained by the transistor 121 and the transistor 122, charge corresponding to data data is held at a node MN between one of a source and a drain of the transistor 121 and a gate of the transistor 122. A transfer of the charge held at the node MN can be considerably reduced when the transistor 121 is kept off.

The transistor 121 is configured to considerably reduce the transfer of the charge held at the node MN when turned off. The charge enters and exits from the node MN mainly through a path between the source and the drain of the transistor 121. To reduce such entry and exit of the charge, the transistor 121 preferably has an extremely low off-state current.

The transistor 121 is preferably a transistor including an oxide semiconductor in a semiconductor layer (such a transistor is referred to as an OS transistor). The OS transistor can be a transistor with an extremely low off-state current. In FIG. 1, the indication of "OS" is given beside a transistor including an oxide semiconductor in order to clearly demonstrate that the transistor is an OS transistor. The transistor 121 is an n-channel transistor in the description.

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on the voltage Vgs in some cases. Thus, "the off-state current of a transistor is lower than or equal to I" may mean "there is a voltage Vgs with which the off-state current of the transistor becomes lower than or equal to I". Furthermore, "the off-state current of a transistor" means "the off-state current in an off state at a predetermined voltage Vgs", "the off-state current in an off state at a voltage Vgs in a predetermined range", "the off-state current in an off state at a voltage Vgs with which sufficiently reduced off-state current is obtained", or the like.

As an example, the assumption is made of an n-channel transistor where the threshold voltage Vth is 0.5 V and the drain current is $1 \times 10^{-9}$ A at a voltage Vgs of 0.5 V, $1 \times 10^{-13}$ A at a voltage Vgs of 0.1 V, $1 \times 10^{-19}$ A at a voltage Vgs of −0.5 V, and $1 \times 10^{-22}$ A at a voltage Vgs of −0.8 V. The drain current of the transistor is $1 \times 10^{-19}$ A or lower at a voltage Vgs of −0.5 V or at a voltage Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the off-state current may be represented with a unit meaning current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required for a semiconductor device or the like including the transistor is ensured or a temperature at which the semiconductor device or the like is used (e.g., temperature in the range of 5° C. to 35° C.). The case where the off-state current of the transistor is lower than or equal to I may indicate the existence of a value of Vgs at which the off-state current of the transistor is lower than or equal to I at room temperature, 60° C., 85° C., 95° C., or 125° C., at a temperature where the reliability required for a semiconductor device or the like including the transistor is ensured, or at a temperature where the semiconductor device or the like is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be off-state current at Vds at which the required reliability of a semiconductor device or the like including the transistor is ensured or Vds used in the semiconductor device or the like including the transistor. The case where the off-state current of the transistor is lower than or equal to I may indicate the existence of Vgs at which the off-state current of the transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds where the required reliability of a semiconductor device or the like including the transistor is ensured or Vds used in the semiconductor device or the like including the transistor.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

The transistor 121 includes a pair of gates (also referred to as a first gate and a second gate) between which the semiconductor layer is positioned. A signal controlling the on/off state of the transistor 121 is applied to one gate and a potential $V_{BG}$ is applied to the other gate.

The potential $V_{BG}$ is a potential for controlling the threshold voltage Vth corresponding to the one gate of the transistor 121, for example. When the potential $V_{BG}$ is lower than the potential of the signal controlling the on/off state of the transistor, the threshold voltage Vth can be increased. Accordingly, the drain current generated when a gate-source voltage Vgs is 0 V can be reduced and the off-state current of the transistor 121 can be reduced.

The on/off state of the transistor 122 is controlled by the potential of the node MN. The transistor 122 may be an OS transistor or a transistor including silicon in a semiconductor layer (a Si transistor). When the transistor 122 is a Si transistor, it can be provided as a stacked layer with the transistor 121 which is an OS transistor, resulting in a reduction in the size of the semiconductor device.

The battery 130 includes a first terminal and a second terminal. The first terminal is on the positive electrode side and the second terminal is on the negative electrode side. In other words, the potential of the first terminal is set higher than the potential of the second terminal. For example, the first terminal of the battery 130 is connected to a wiring through which the potential VSS1 is applied. The second terminal of the battery 130 is connected to a wiring through which the potential $V_{BG}$ to be applied to the back gate of the transistor 121 is applied.

When the electromotive force of the battery 130 is referred to as a voltage $V_{BAT}$, the potential of the second terminal is lower than the potential VSS1 of the first terminal by the voltage $V_{BAT}$. This potential (VSS1–$V_{BAT}$) is used as the potential $V_{BG}$ applied to the back gate of the transistor 121, so that the threshold voltage of the transistor 121 can be controlled.

The potential VSS1 can be constant like a ground potential. When the battery 130 is charged, the voltage $V_{BAT}$ can be constant. The battery 130 can continue to keep the potential of the back gate of the transistor 121 constant; accordingly, a change in the potential of the back gate of the transistor 121 can be kept small. In addition, with the potential of the back gate of the transistor 121, the threshold voltage of the transistor can be high. Thus, the circuit 120 can have excellent data retention characteristics.

Through the wiring through which the potential $V_{BG}$ is applied, not only the potential (VSS1–$V_{BAT}$) using the battery 130 can be applied but also a lower potential VSS2 (<VSS1–$V_{BAT}$) can be applied by an operation of the voltage generation circuit 140. This potential VSS2 is periodically applied to the wiring through which the potential $V_{BG}$ is applied, whereby a voltage higher than the voltage $V_{BAT}$ can be applied between the terminals in the battery 130. Thus, the battery 130 can be charged periodically.

As the battery 130, a plurality of batteries may be connected in series or in parallel. The battery 130 is preferably fabricated using an inorganic solid electrolyte that can be formed by a sputtering method, an evaporation method, or a CVD method. Examples of the inorganic solid electrolyte are a sulfide-based solid electrolyte and an oxide-based solid electrolyte. Alternatively, a polymer-based solid electrolyte may be used. Still alternatively, a composite solid electrolyte containing any of the above inorganic solid electrolytes and a polymer-based solid electrolyte may be used.

The battery 130 is preferably stacked with elements such as transistors included in the circuit 110 and the circuit 120. The area of a region of the battery 130 where a positive electrode active material and a negative electrode active material overlap with each other can be reduced to approximately greater than or equal to 0.01 cm$^2$ and less than or equal to 1 cm$^2$ so that the battery 130 can be formed in each semiconductor device.

The voltage generation circuit 140 has a function of generating the potential VSS2, which is lower than the potential VSS1, in accordance with a change in potential $V_{VDD}$. For example, the voltage generation circuit 140 generates the potential VSS2 by utilizing a change in potential $V_{VDD}$.

The switch 150 is turned off for power gating to release charge accumulated in the circuit 110, and the release of charge changes the potential $V_{VDD}$. In the voltage generation circuit 140, using capacitive coupling, the potential of a node in the voltage generation circuit 140, which is set to the potential VSS1, is decreased in accordance with the change in potential $V_{VDD}$; the potential VSS2 lower than the potential VSS1 is thus generated.

In the above configuration, the potential VSS2 can be generated utilizing the power gating operation. Since, in the battery 130, a voltage higher than the voltage $V_{BAT}$ can be applied between the terminals every power gating operation, the battery 130 can be charged periodically.

The switch 150 has a function of controlling the state of conduction between the circuit 110 and the wiring through which the potential VDD is applied. Controlling the on/off state of the switch 150 can cause a change of the potential $V_{VDD}$ to the potential VDD or the potential VSS1. One terminal of the switch 150 is connected to the wiring through which the potential VDD is applied. The other terminal of the switch 150 is connected to the circuit 110 and the voltage generation circuit 140. As the switch 150, a p-channel transistor can be used.

Figure 2B:
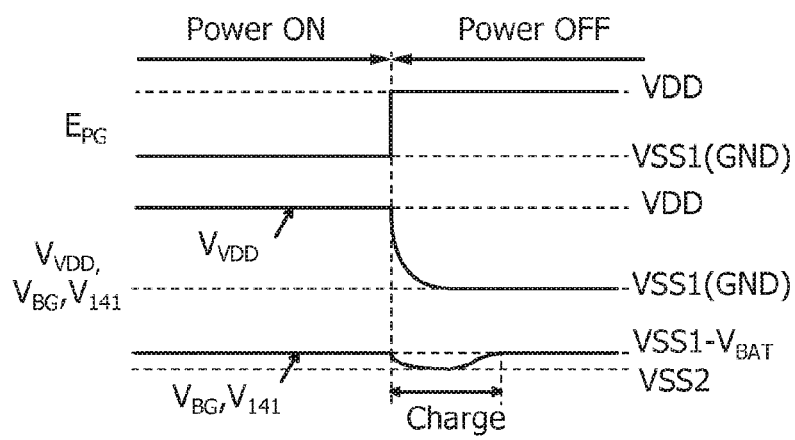

FIG. 2A specifically illustrates an example of circuit configurations of the voltage generation circuit 140 and the switch 150 in the semiconductor device 100 illustrated in FIG. 1. FIG. 2B illustrates an operation example of the semiconductor device 100.

In FIG. 2A, a voltage generation circuit 140A is illustrated as an example of the voltage generation circuit 140 in the semiconductor device 100 illustrated in FIG. 1.

In the circuit diagram of FIG. 2A, the voltage generation circuit 140A includes a capacitor 141 and diodes 142 and 143. In FIG. 2A, the potential of a wiring through which the capacitor 141 is connected to the diodes 142 and 143 is referred to as a potential $V_{141}$.

One electrode of the capacitor 141 is connected to a wiring through which the potential $V_{vi}$ is applied. The other electrode of the capacitor 141 is connected to a wiring through which the potential $V_{141}$ is applied. One electrode of the diode 142 is connected to the wiring through which the potential $V_{141}$ is applied. The other electrode of the diode 142 is connected to the wiring through which the potential VSS1 is applied. One electrode of the diode 143 is connected to the wiring through which the potential $V_{BG}$ is applied. The other electrode of the diode 143 is connected to the wiring through which the potential $V_{141}$ is applied.

In the circuit diagram in FIG. 2A, the switch 150 includes a p-channel transistor 151.

A gate of the transistor 151 is connected to a wiring through which a control signal $E_{PG}$ is applied. One of a source and a drain of the transistor 151 is connected to the wiring through which the potential VDD is applied. The other of the source and the drain of the transistor 151 is connected to the wiring through which the potential $V_{VDD}$ is applied to the circuit 110 and the voltage generation circuit 140. The control signal $E_{PG}$ controls the on/off state of the transistor 151.

FIG. 2B is a timing chart showing an operation example of the semiconductor device 100 illustrated in FIG. 2A. Using FIG. 2B, a description is given of an operation at the time when the state in which a power supply voltage is supplied to the circuit 110 is changed by the switch 150 to the state in which the supply of a power supply voltage is stopped.

During the period of supply of a power supply voltage (Power ON), the control signal $E_{PG}$ is set to "L" to turn on the transistor 151. At this time, the potential $V_{VDD}$ becomes the potential VDD. The potentials $V_{BG}$ and $V_{141}$ become the potential (VSS1−$V_{BAT}$). As a result, the potential of the back gate of the transistor 121 can be applied from the battery 130.

During the period of stopping the supply of a power supply voltage (Power OFF), the control signal $E_{PG}$ is set to "H" to turn off the transistor 151. At this time, the potential $V_{VDD}$ becomes the potential VSS1 (GND). As the potential $V_{VDD}$ is decreased, the potentials $V_{BG}$ and $V_{141}$ are decreased to the potential VSS2 because of the capacitive coupling of the capacitor 141. Consequently, a voltage greater than or equal to the electromotive force $V_{BAT}$ is applied to the battery 130 to charge the battery 130. Charging the battery allows a current flow into the battery 130, so that the potential $V_{BG}$ is gradually increased to the potential (VSS1−$V_{BAT}$). When charging the battery 130 is stopped, the potential $V_{BG}$ becomes constant at the potential (VSS1−$V_{BAT}$).

As described above using the circuit configuration and timing chart in FIGS. 2A and 2B, in one embodiment of the present invention, the transistor 121 with a low off-state current in the circuit 120 can be utilized to save and retain data stored in the circuit 110, and the potential $V_{BG}$ to be applied to the back gate of the transistor 121 can be applied from the battery 130 corresponding to the circuit 110. In one embodiment of the present invention, the potential to be applied to the back gate of the transistor 121 and a potential for charging the battery 130 are generated in the voltage generation circuit 140. Using power gating of the semiconductor device 100 by the switch 150, the potential can be generated in the voltage generation circuit 140 and the battery is charged.

The potential to be applied to the back gate of the transistor 121 in the circuit 120 for saving and retaining the data stored in the circuit 110 is applied from the battery 130. The battery 130 can continue to keep the potential $V_{BG}$ of the back gate of the transistor 121 constant; accordingly, a change in potential can be kept small. In addition, with the potential $V_{BG}$ of the back gate of the transistor 121, a threshold voltage of the transistor can be kept high. Thus, the circuit 120 can have excellent data retention characteristics.

In Embodiment 1, one embodiment of the present invention has been described. Other embodiments of the present invention will be described in Embodiments 2 to 10. Note that one embodiment of the present invention is not limited to these embodiments. Although a voltage is applied to the back gate of the transistor 121 by using the battery 130 corresponding to the circuit 110 in one embodiment of the present invention, the battery 130 corresponding to the circuit 110 may be provided such that a voltage may be applied to any of a variety of wirings, elements, and electrodes depending on the case or situation. For example, in one embodiment of the present invention, a voltage from any of a variety of sources may be applied to the back gate of the transistor 121 depending on the case or situation. For example, in one embodiment of the present invention, a voltage from the battery 130 corresponding to the circuit 110 is not necessarily applied to the back gate of the transistor 121 depending on the case or situation.

The structure described in this embodiment can be used in appropriate combination with the structure described in any of the other embodiments.

Embodiment 2

In this embodiment, an example of a circuit configuration different from that described in Embodiment 1 is described. In particular, a circuit configuration and an operation that are different from those of the voltage generation circuit in Embodiment 1 are described in this embodiment.

Figure 3:
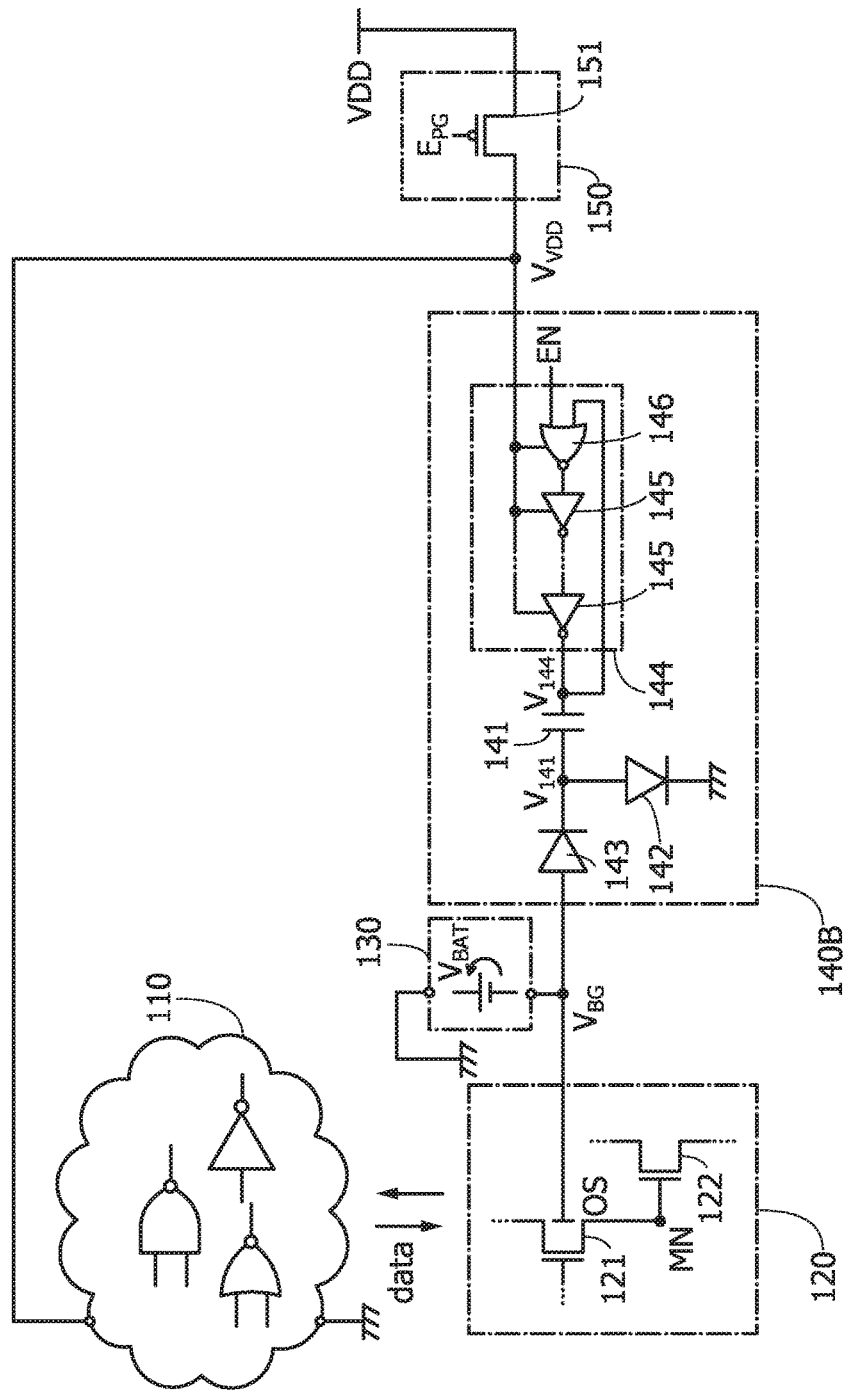
FIG. 3 is a circuit diagram illustrating one embodiment of the present invention.

In a circuit diagram of the semiconductor device 100 in FIG. 3, a voltage generation circuit 140B includes an oscillator circuit 144 in addition to the capacitor 141 and the diodes 142 and 143. The oscillator circuit 144 includes an inverter chain of inverters 145 and a NOR 146 to which a control signal EN and an output signal of the oscillator circuit 144 are input.

A power supply voltage is supplied to the inverters 145 and the NOR 146 when the potential $V_{VDD}$ changes to the potential VDD. In the oscillator circuit 144, oscillation is controlled in accordance with the control signal EN. In FIG. 3, the potential of the output signal of the oscillator circuit 144 is referred to as a potential $V_{144}$.

The other components are similar to those in FIG. 2A and therefore not described.

Figure 4:
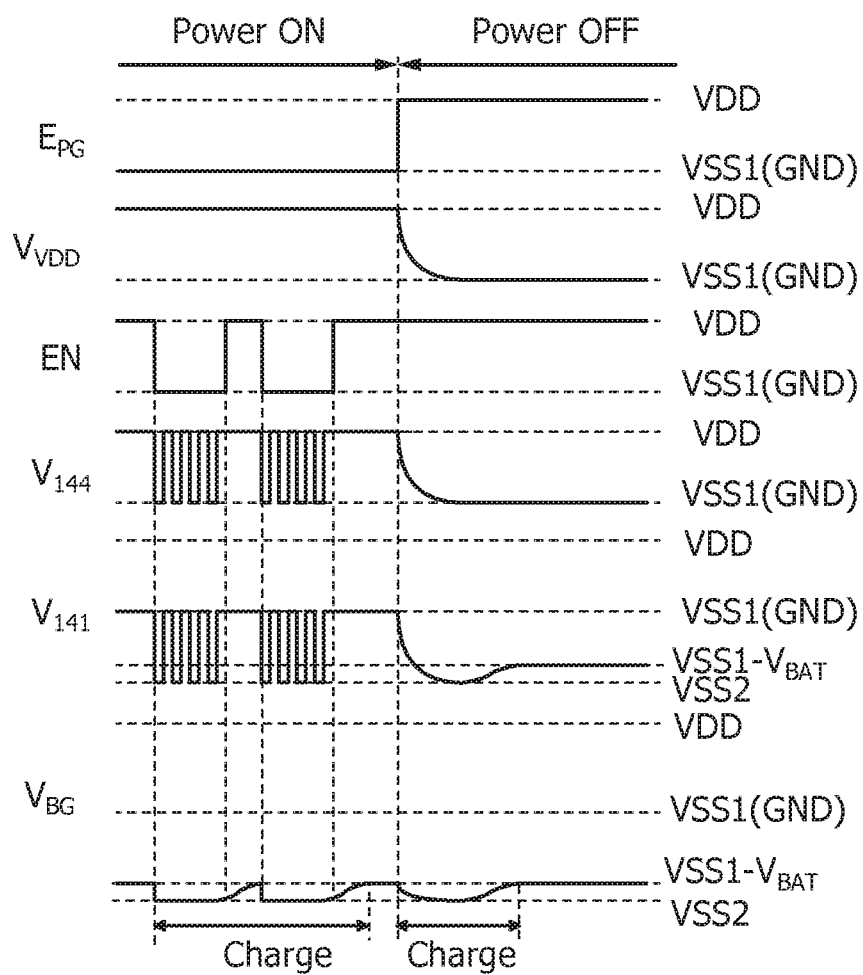
FIG. 4 is a timing chart illustrating one embodiment of the present invention.
Figure 5:
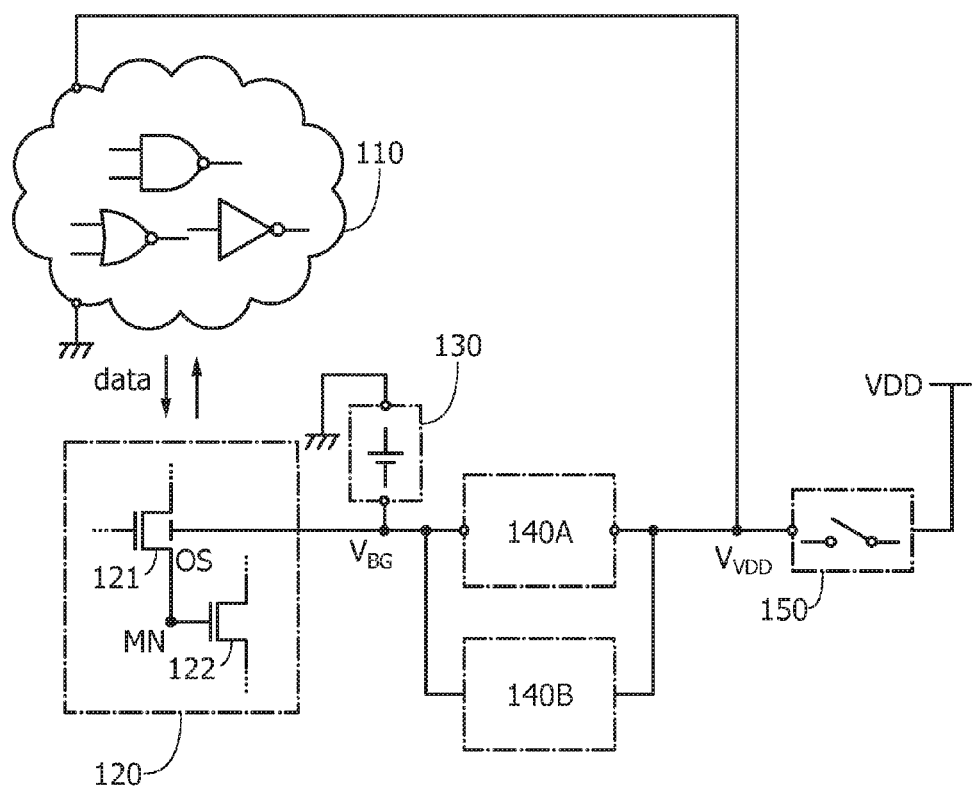
FIG. 5 is a block diagram illustrating one embodiment of the present invention.

FIG. 4 is a timing chart showing an operation example of the semiconductor device 100 illustrated in FIG. 3. Using FIG. 4, a description is given of an operation at the time when the state in which a power supply voltage is supplied to the circuit 110 is changed by the switch 150 to the state in which the supply of a power supply voltage is stopped.

During the period of supply of a power supply voltage (Power ON), the control signal $E_{PG}$ is set to "L" to turn on the transistor 151. At this time, the potential $V_{VDD}$ becomes the potential VDD. The control signal EN is intermittently set to "L". The oscillator circuit 144 oscillates in a period during which the control signal EN is set to "L". The oscillator circuit 144 oscillates so that the potential $V_{144}$, which is the output signal of the oscillator circuit 144, changes to and from the potential VDD and the potential VSS1. The oscillator circuit 144 oscillates so that the potential $V_{141}$ changes to and from the potential VSS1 and the potential VSS2. During the change of potential $V_{141}$ to the potential VSS2, the potential $V_{BG}$ can be set to the potential VSS2. Therefore, at the timing when the control signal EN is set to "L", the battery 130 can be charged. Thus, in a period of supply of a power supply voltage, the battery 130 can be charged periodically.

During the period of stopping the supply of a power supply voltage (Power OFF), the control signal $E_{PG}$ is set to "H" to turn off the transistor 151. In addition, the control signal EN is set to "H". At this time, the potential $V_{VDD}$ becomes the potential VSS1 (GND). As the potential $V_{144}$ is decreased, capacitive coupling of the capacitor 141 occurs and the potentials $V_{BG}$ and $V_{141}$ are decreased to the potential VSS2. Consequently, a voltage greater than or equal to the electromotive force $V_{BAT}$ is applied to the battery 130 to charge the battery 130. Charging the battery allows a current flow into the battery 130, so that the potential $V_{BG}$ is gradually increased to the potential (VSS1−$V_{BAT}$). When charging the battery 130 is stopped, the potential $V_{BG}$ becomes constant at the potential (VSS1−$V_{BAT}$).

The voltage generation circuit 140B may be provided in parallel with the voltage generation circuit 140A described in Embodiment 1, in which case the potential $V_{BG}$ is periodically reduced so that the battery can be charged. FIG.

5 shows an example of a block diagram of the semiconductor device having such a configuration.

As described above using the circuit configuration and timing chart in FIGS. 3 and 4, in one embodiment of the present invention, the transistor 121 with a low off-state current in the circuit 120 can be utilized to save and retain data stored in the circuit 110, and the potential to be applied to the back gate of the transistor 121 can be applied from the battery 130 corresponding to the circuit 110. In one embodiment of the present invention, the potential to be applied to the back gate of the transistor 121 and a potential for charging the battery 130 are generated in the voltage generation circuit 140. Using power gating of the semiconductor device 100 by the switch 150, the potential can be generated in the voltage generation circuit 140 and the battery is charged.

The potential $V_{BG}$ applied to be to the back gate of the transistor 121 in the circuit 120 for saving and retaining the data stored in the circuit 110 is applied from the battery 130. The battery 130 can continue to keep the potential $V_{BG}$ of the back gate of the transistor 121 constant; accordingly, a change in potential can be kept small when the battery is not charged. In addition, with the potential $V_{BG}$ of the back gate of the transistor 121, a threshold voltage of the transistor can be kept high. Thus, the circuit 120 can have excellent data retention characteristics.

The structure described in this embodiment can be used in appropriate combination with the structure described in any of the other embodiments.

Embodiment 3

Figure 6A:
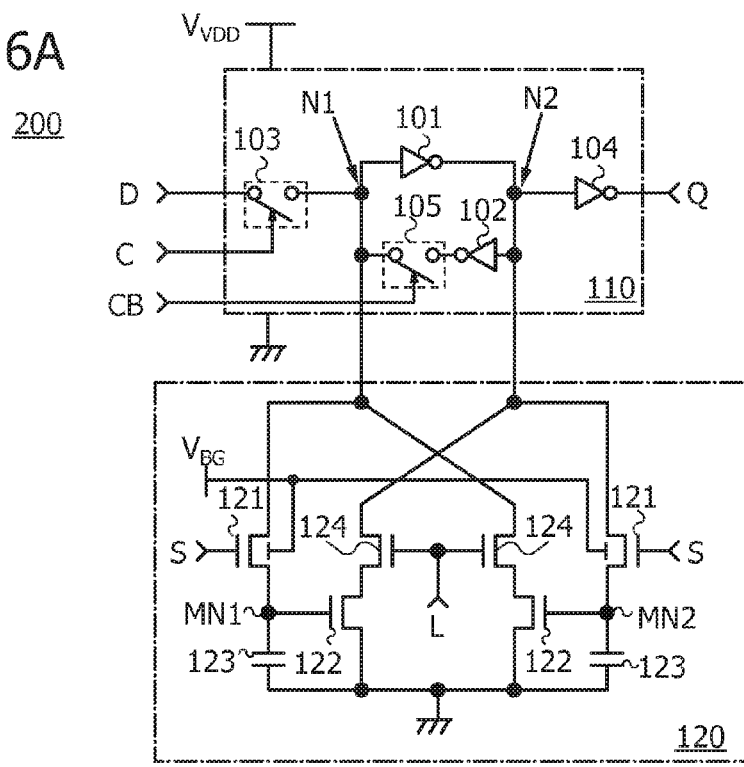
FIGS. 6A and 6B are a circuit diagram and a timing chart illustrating one embodiment of the present invention.

In this embodiment, examples of the circuit 110 and the circuit 120 described in Embodiment 1 or 2 and an operation thereof are described. FIG. 6A illustrates a specific circuit diagram of the circuits 110 and 120. The circuits 110 and 120 illustrated as an example in FIG. 6A are function as a latch circuit 200 capable of saving data. Data is retained in the circuit 110 during supply of a power supply voltage, whereas the data is retained in the circuit 120 when the supply of a power supply voltage is stopped.

The circuit 110 includes a node N1 and a node N2, at which potentials corresponding to data "1" and data "0" can be held during the period of continuing the supply of a power supply voltage. The potential $V_{VDD}$ and the potential VSS1, which are described in Embodiment 1, are applied to the circuit 110.

The circuit 110 includes, for example, an inverter 101, an inverter 102, a switch 103, an inverter 104, and a switch 105.

For example, a data signal D, a clock signal C, and an inverted clock signal CB are input into the circuit 110, and an output signal Q is output from the circuit 110.

An input terminal of the inverter 101 is connected to the node N1. An output terminal of the inverter 101 is connected to the node N2.

An input terminal of the inverter 102 is connected to the node N2. An output terminal of the inverter 102 is connected to one terminal of the switch 105. The other terminal of the switch 105 is connected to the node N1. The on and off of the switch 105 are controlled by the inverted clock signal CB.

One terminal of the switch 103 is connected to a wiring through which the data signal D is supplied. The other terminal of the switch 103 is connected to the node N1. The on and off of the switch 103 are controlled by the clock signal C.

An input terminal of the inverter 104 is connected to the node N2. An output terminal of the inverter 104 is connected to a wiring through which the output signal Q is supplied.

The switch 103 and the switch 105 may each be, for example, an analog switch. Alternatively, the switch 103 and the switch 105 each can be a transistor.

Although the inverter 102 and the switch 105 are separately provided, one clocked inverter may be used instead of the inverter 102 and the switch 105.

The inverters 101, 102, and 104 are supplied with a power supply voltage by applying the potential $V_{VDD}$ and the potential VSS1 thereto.

The circuit 120 includes a node MN1 and a node MN2, at which potentials corresponding to data can be held during the period of stopping the supply of a power supply voltage.

The circuit 120 includes the transistor 121, the transistor 122, a capacitor 123, and a transistor 124 for each of the nodes N1 and N2. The circuit 120 further includes the nodes MN1 and MN2, at which the potentials corresponding to data "1" and data "0" held at the nodes N1 and N2 in the circuit 110 can be held at least during the period of stopping the supply of a power supply voltage. Note that as an example, the transistors 121, 122, and 124 are n-channel transistors in the following description.

A gate of the transistor 121 is connected to a wiring through which a control signal Save (denoted by S in the drawing) is supplied. The back gate of the transistor 121 is connected to a wiring through which the potential $V_{BG}$ is applied. One of the source and the drain of the transistor 121 is connected to the node N1 (node N2). The other of the source and the drain of the transistor 121 is connected to the node MN1 (MN2).

One electrode of the capacitor 123 is connected to the node MN1 (MN2). The other electrode of the capacitor 123 is connected to the wiring through which the potential VSS1 is applied. Note that the capacitor 123 can be omitted when the transistor 122 has large gate capacitance, for example.

A gate of the transistor 122 is connected to the node MN1 (MN2). One of a source and a drain of the transistor 122 is connected to a wiring through which a potential VSS1 is applied. Note that as an example, the transistor 122 is an n-channel transistor in the following description.

A gate of the transistor 124 is connected to a wiring through which a control signal Load (denoted by L in the drawing) is supplied. One of a source and a drain of the transistor 124 is connected to the other of the source and the drain of the transistor 122. The other of the source and the drain of the transistor 124 is connected to the node N2 (N1).

The control signal Save is a signal for changing the state of conduction between the node N1 (N2) and the node MN1 (MN2). When the control signal Save is changed to H level, data in the node N1 (N2) in the circuit 110 can be saved to the node MN1 (MN2). When the control signal Save is changed to L level, the node MN1 (MN2) can continuously hold charge corresponding to the data.

The control signal Load is a signal for changing the state of conduction between the node N2 (N1) and the other of the source and the drain of the transistor 122. The control signal Load is changed to H level, data in the node MN1 (MN2) in the circuit 120 can be restored to the node N2 (N1). In the circuit 120, the potential difference between the potentials held in the nodes MN1 and MN2 affects the difference of channel resistance between the transistors 122; thus, the potential difference can be generated at the nodes N2 and N1 in the circuit 110. Then, when the supply of a power supply voltage to the circuit 110 is restarted, the data can be restored to the circuit 110.

Figure 6B:
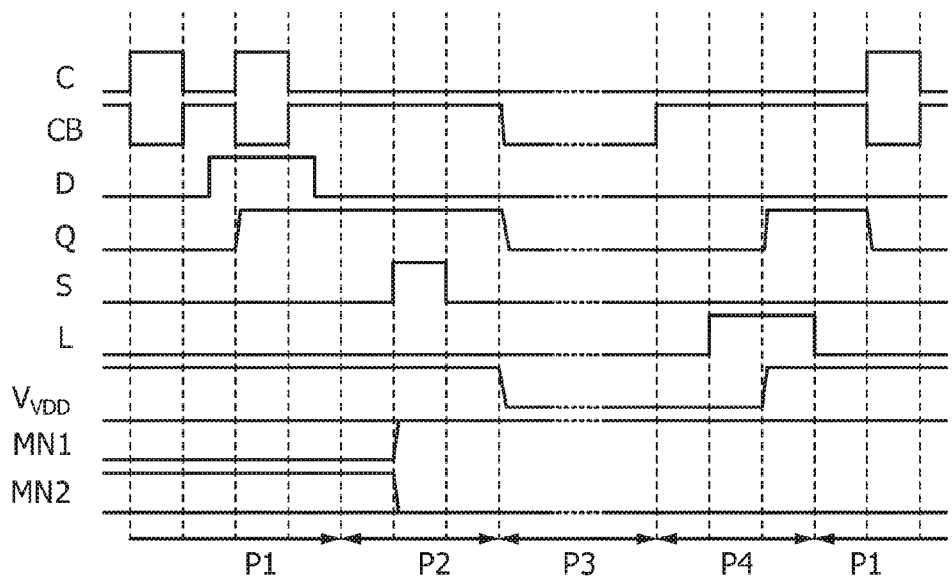

FIG. 6B shows a timing chart of the latch circuit 200 illustrated in FIG. 6A.

The timing chart in FIG. 6B shows changes in the potentials of the signals described using FIG. 6A, i.e., the potentials of the clock signal C, the inverted clock signal CB, the data signal D, the output signal Q, the control signal S, the control signal L, the node MN1, and the node MN2, and the potential $V_{VDD}$.

The timing chart in FIG. 6B shows states of the latch circuit 200 in periods P1 to P4. The period P1 is a normal operation period. The period P2 is a transition period for operation stop. The period P3 is an operation stop period. The period P4 is a transition period for operation restart.

In the period P1 which is the normal operation period, the circuit 110 can operate as a latch circuit.

In the period P2 which is a transition period for operation stop, the clock signal C and the inverted clock signal CB are not changed. The control signal S is set to H level to save data from the circuit 110 to the circuit 120. For example, in FIG. 6B, an L-level potential and an H-level potential are held at the node MN1 and the node MN2, respectively. In the period P2, supply of a power supply voltage to the latch circuit 200 is stopped.

In the period P3 which is the operation stop period, the signals are each set to L level, so that power consumption of the latch circuit 200 is substantially zero. Note that the potential of the node MN1 (MN2) is kept constant because almost no current flows.

In the period P4 which is the transition period for operation restart, first, the potentials of the clock signal C and the inverted clock signal CB are set to those in the period P2 which is the transition period for operation stop. Then, the control signal L is set to H level, whereby the supply of a power supply voltage is restarted. At this time, the potential of the node MN1 (MN2) is loaded into the node N2 (N1) of the circuit 110 by utilizing the difference of channel resistance between the transistors 122.

Then, supply of the clock signal C and the inverted clock signal CB is restarted, and the period P1 which is the normal operation can be restarted.

As described above, in the circuit configuration and the timing chart shown in FIGS. 6A and 6B, the potential for holding charge corresponding to data, which is to be applied to the back gate of the transistor 121, is applied as described in Embodiment 1 or 2, i.e., applied from the battery 130 corresponding to the circuit 110. The battery 130 can continue to keep the potential of the back gate of the transistor 121 constant; accordingly, a change in potential can be kept small. In addition, with the potential of the back gate of the transistor 121, the threshold voltage of the transistor can be kept high. Thus, the circuit 120 can have excellent data retention characteristics.

Figure 7A:
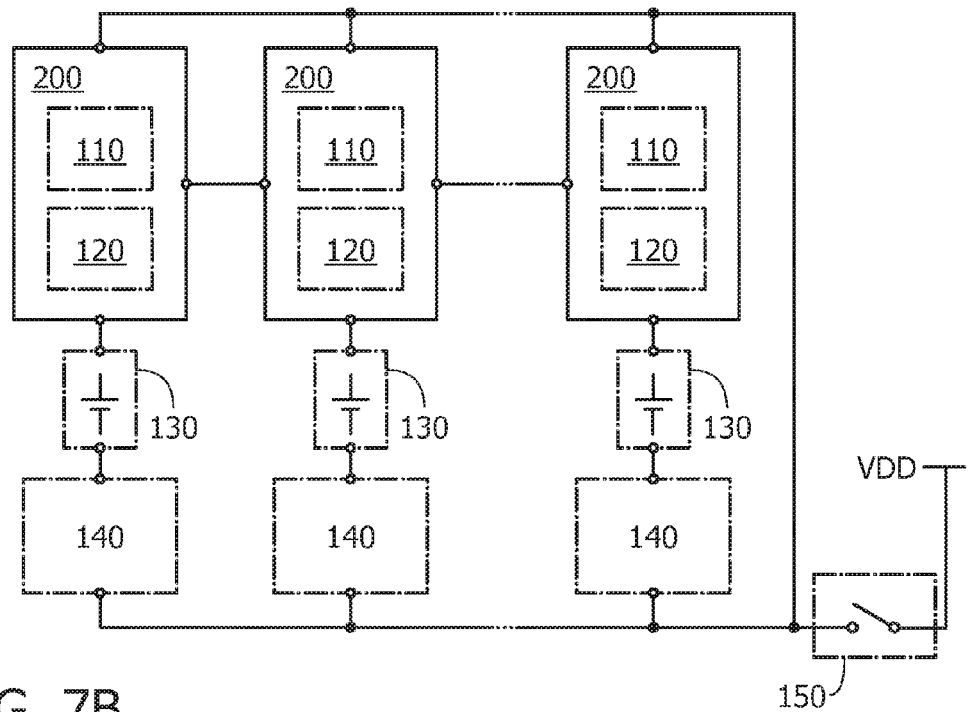
FIGS. 7A and 7B are each a block diagram illustrating one embodiment of the present invention.
Figure 7B:
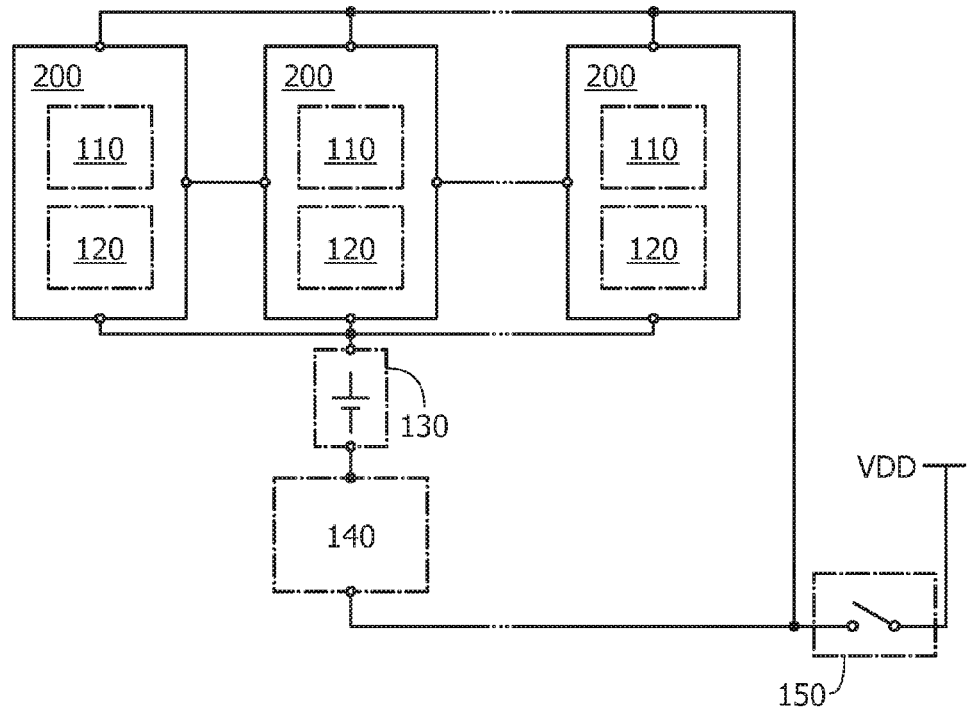

Note that the battery may be provided for each latch circuit 200 or each plurality of latch circuits. For example, as in FIG. 7A, the battery 130 and the voltage generation circuit 140 may be provided for each latch circuit 200 including the circuits 110 and 120. Although one switch 150 is provided for plurality of latch circuits 200 in FIG. 7A, a plurality of switches 150 may be provided. Alternatively, as in FIG. 7B, one set of battery 130 and voltage generation circuit 140 may be shared by the plurality of latch circuits 200 each including the circuits 110 and 120.

The latch circuit capable of saving data, which is described with reference to FIGS. 6A and 6B and FIGS. 7A and 7B, can be used as a register in a semiconductor device functioning as an arithmetic processing circuit. An example of the semiconductor device functioning as an arithmetic processing circuit is described.

Figure 8:
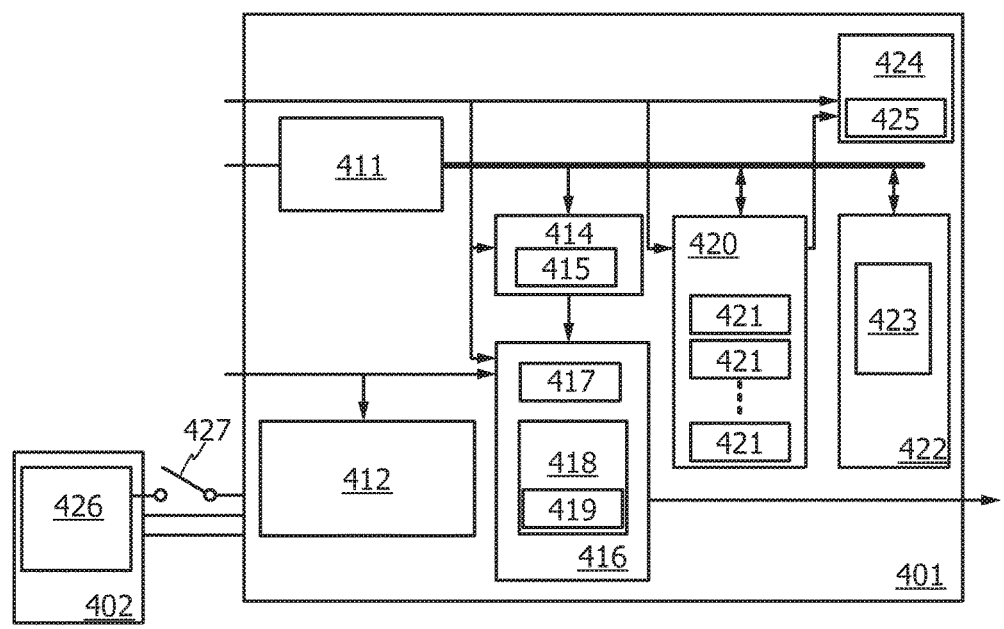
FIG. 8 is a block diagram illustrating one embodiment of the present invention.

FIG. 8 illustrates a configuration example of the semiconductor device functioning as an arithmetic processing circuit. The semiconductor device shown in FIG. 8 includes an arithmetic processing portion 401 and a power supply portion 402. The arithmetic processing portion 401 includes a circuit 411 having functions of a data latch and a selector, a circuit 412 having functions of an internal clock generator and a reset controller, a decode portion 414, an arithmetic control portion 416, a register set 420, an arithmetic portion 422, and an address buffer 424. The power supply portion 402 includes a power supply circuit 426.

A power supply potential is supplied to components of the arithmetic processing portion 401 from the power supply portion 402. A power supply control switch 427 corresponds to the above-described switch 150.

Components of the arithmetic processing portion 401 are described.

The circuit 411 controls latch and output of input data.

The circuit 412 controls timings of generation and reset of the clock signal.

The decode portion 414 is provided with a register 415 which is an instruction register and an instruction decoder. The decoder portion 414 has a function of decoding input instruction data and analyzing the instruction.

The arithmetic control portion 416 includes a state generation portion 418 and a register 417. Further, the state generation portion 418 includes a register 419. The state generation portion 418 generates a signal for determining the state of the semiconductor device.

The register set 420 includes a plurality of registers 421. The plurality of registers 421 include registers functioning as a program counter, a general register, and an arithmetic register. The register set 420 has a function of storing data necessary for arithmetic processing.

The arithmetic portion 422 includes an arithmetic logic unit (ALU) 423. The arithmetic portion 422 has a function of performing arithmetic processing of data input from the ALU 423. Note that a register may be provided also in the arithmetic portion 422.

The address buffer 424 includes a register 425. The address buffer 424 is a buffer gate for address data.

A write control signal WE and a read control signal RD are input into the arithmetic processing portion 401. Via a data bus, 8-bit data is input into the arithmetic processing portion 401. Moreover, an arithmetic control signal is input into the arithmetic processing portion 401.

The arithmetic processing portion 401 outputs 16-bit address data. Further, the arithmetic processing portion 401 outputs a bus control signal.

The write control signal WE and the read control signal RD are input into the circuit 412, the arithmetic control portion 416, the register set 420, and the address buffer 424. Via the data bus, 8-bit data is input into the circuit 412, the register set 420, and the arithmetic portion 422. The arithmetic control signal is input into the circuit 412 and the arithmetic control portion 416.

The address buffer 424 outputs the 16-bit address data. Further, the arithmetic control portion 416 outputs the bus control signal.

Each of the circuits in the arithmetic processing portion 401 can input and output data, an address, and an arithmetic control signal via an address bus and a control bus in addition to the data bus.

Each of the registers provided in the arithmetic processing portion 401 has a function of retaining data for a certain period of time in data processing. As a circuit having such a function, the latch circuit capable of saving data, which is described with reference to FIGS. 6A and 6B and FIGS. 7A and 7B, can be used. Thus, the potential for holding charge corresponding to data, which is to be applied to the back gate of the transistor 121, is applied using the configuration described in Embodiment 1 or 2, i.e., applied from the battery 130 corresponding to the circuit 110. The battery 130 can continue to keep the potential of the back gate of the transistor 121 constant; accordingly, a change in potential can be kept small. In addition, with the potential of the back gate of the transistor 121, the threshold voltage of the transistor can be kept high. Thus, the circuit 120 can have excellent data retention characteristics.

The structure described in this embodiment can be used in appropriate combination with the structure described in any of the other embodiments.

Embodiment 4

Figure 9:
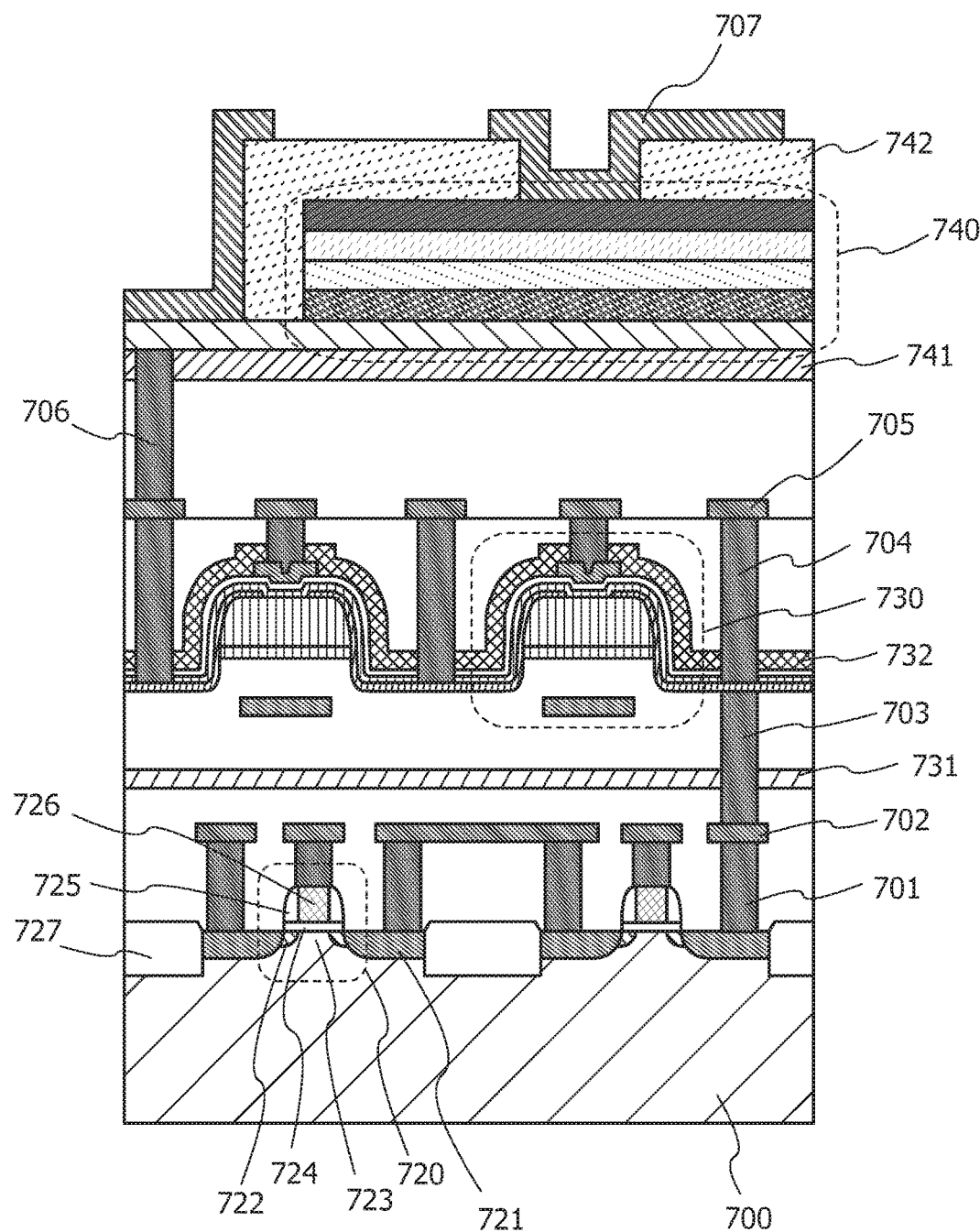
FIG. 9 is a cross-sectional view illustrating one embodiment of the present invention.
Figure 10:
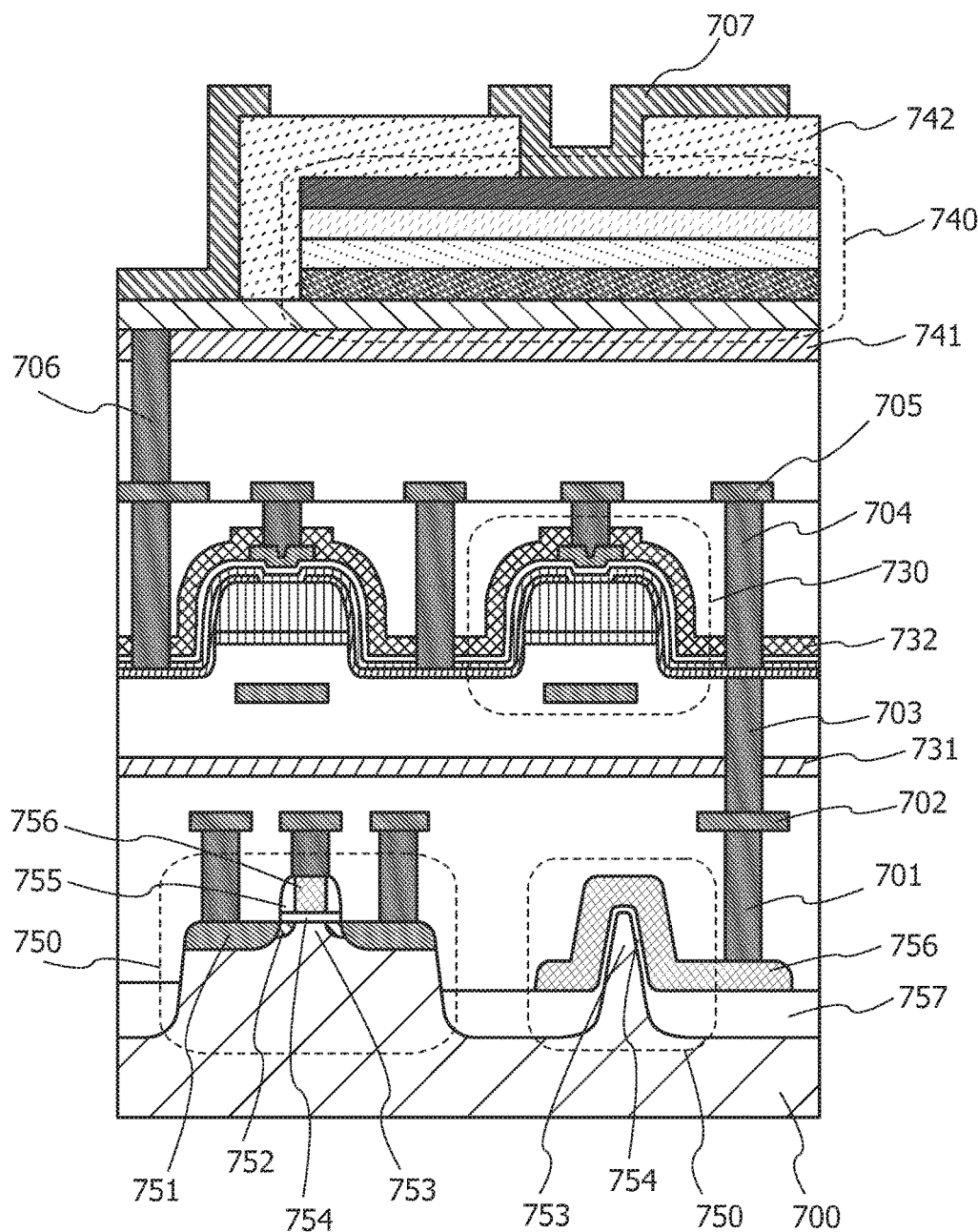
FIG. 10 is a cross-sectional view illustrating one embodiment of the present invention.
Figure 11:
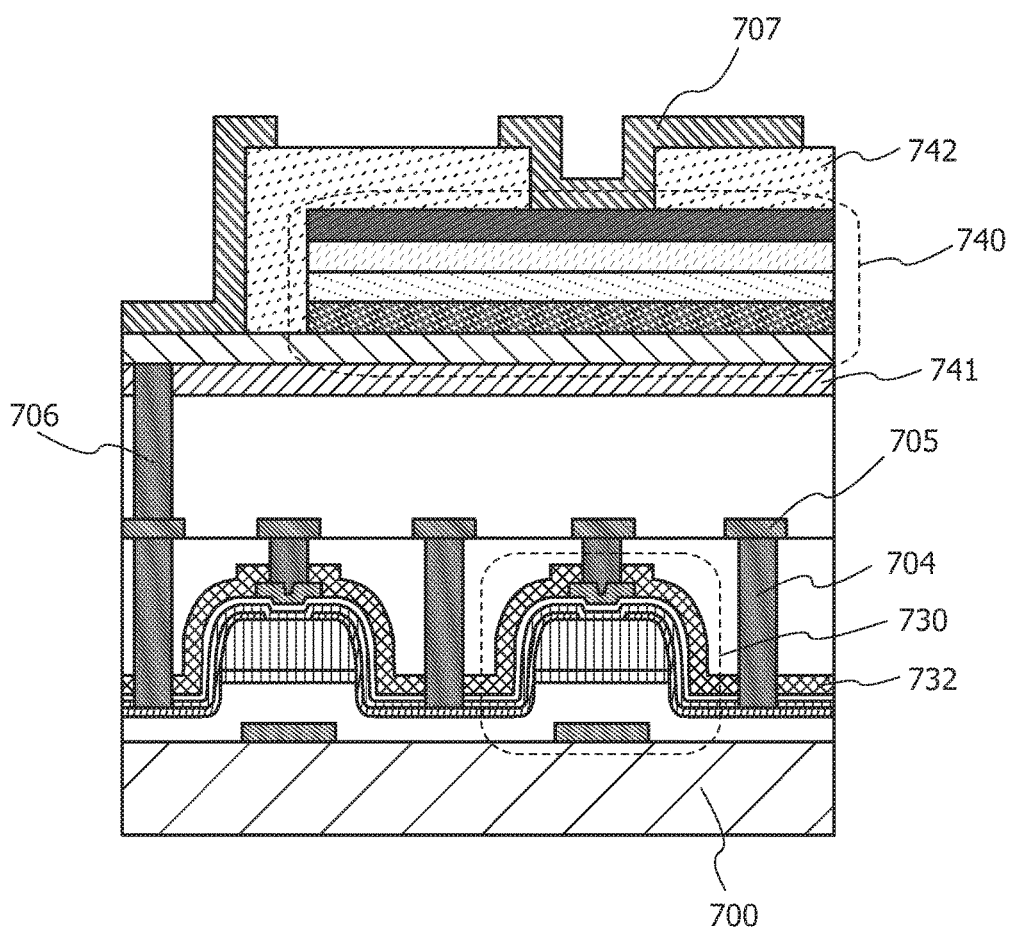
FIG. 11 is a cross-sectional view illustrating one embodiment of the present invention.

In this embodiment, cross-sectional views of the transistors and battery that can be used in the semiconductor device 100 described in Embodiment 1 or 2 are described using FIGS. 9 to 11.

<Example 1 of Cross-Sectional View>

FIG. 9 shows a cross-sectional view of a semiconductor device 1000 including transistors 720, transistors 730, and a battery 740, which are formed over the same substrate. The transistors 720 are provided over a substrate 700, the transistors 730 are provided above the transistors 720, and the battery 740 is provided above the transistors 730.

The semiconductor device 1000 includes the substrate 700, the transistors 720, an element isolation layer 727, an insulating film 731, the transistors 730, an insulating film 732, an insulating film 741, the battery 740, an insulating film 742, plugs 701, 703, 704, and 706, and wirings 702, 705, and 707. The transistors 720 include a gate electrode 726, a gate insulating film 724, a sidewall insulating layer 725, an impurity region 721 functioning as a source region or a drain region, an impurity region 722 functioning as a lightly doped drain (LDD) region or an extension region, and a channel formation region 723.

The impurity concentration is higher in the impurity region 721 than in the impurity region 722. The impurity region 721 and the impurity region 722 can be formed in a self-aligned manner, with the gate electrode 726 and the sidewall insulating layer 725 used as a mask.

As the substrate 700, a single crystal semiconductor substrate or a polycrystalline semiconductor substrate including silicon or silicon carbide as a material, a compound semiconductor substrate including silicon germanium as a material, a silicon-on-insulator (SOI) substrate, or the like can be used. A transistor manufactured using a semiconductor substrate can operate at high speed easily. In the case where a p-type single crystal silicon substrate is used as the substrate 700, an impurity element imparting n-type conductivity may be added to part of the substrate 700 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like can be used.

Alternatively, the substrate 700 may be a conductor substrate or an insulating substrate over which a semiconductor film is provided. Examples of the conductor substrate include a stainless steel substrate, a substrate including stainless steel foil, a tungsten substrate, and a substrate including tungsten foil. Examples of the insulating substrate include a glass substrate, a quartz substrate, a plastic substrate, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of a base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability, or high heat resistance can be provided, or reduction in weight or thickness can be achieved.

The transistors 720 over the substrate 700 are separated from each other by the element isolation layer 727.

As the transistor 720, a transistor containing silicide (salicide) or a transistor that does not include a sidewall insulating layer may be used. When a structure that contains silicide (salicide) is used, resistance of the source region and the drain region can be further lowered and the speed of the semiconductor device can be increased. Furthermore, the semiconductor device can be operated at low voltage; thus, power consumption of the semiconductor device can be reduced.

The transistors 730 are oxide semiconductor transistors. The details of the transistors 730 will be described later in Embodiment 5.

A layer in which the transistors 720 are provided may be omitted so that the transistors 730 can be formed over the substrate 700. A cross-sectional view of that case is illustrated in FIG. 11.

Here, in the case where a silicon-based semiconductor material is used for the transistors 720 provided in a lower layer, hydrogen in an insulating film provided in the vicinity of the semiconductor film of the transistors 720 terminates dangling bonds of silicon; accordingly, the reliability of the transistors 720 can be improved. Meanwhile, in the case where an oxide semiconductor is used for the transistors 730 provided in an upper layer, hydrogen in an insulating film provided in the vicinity of the semiconductor film of the transistors 730 becomes a factor of generating carriers in the oxide semiconductor; thus, the reliability of the transistors 730 might be decreased. Therefore, in the case where the transistors 730 using an oxide semiconductor are provided above the transistors 720 using a silicon-based semiconductor material, it is particularly effective that the insulating film 731 having a function of preventing diffusion of hydrogen is provided between the transistors 720 and 730. The insulating film 731 makes hydrogen remain in the lower layer, thereby improving the reliability of the transistors 720. In addition, since the insulating film 731 suppresses diffusion of hydrogen from the lower layer to the upper layer, the reliability of the transistors 730 can also be improved.

The insulating film 731 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, the insulating film 732 having a function of preventing diffusion of hydrogen is preferably formed over the transistors 730 to cover the transistors 730 including an oxide semiconductor film. For the insulating film 732, a material that is similar to that of the insulating film 731 can be used, and in particular, an aluminum oxide film is preferably used. An aluminum oxide film has a high shielding (blocking) effect of preventing penetration of both oxygen and impurities such as hydrogen and moisture. Thus, by using an aluminum oxide film as the insulating film 732 covering the transistors 730, release of oxygen from the oxide semiconductor film included in the transistors 730 can be prevented and entry of water and hydrogen into the oxide semiconductor film can be prevented.

The plugs 701, 703, 704, and 706 and the wirings 702, 705, and 707 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable that the plugs 701, 703, 704, and 706 and the wirings 702, 705, and 707 be formed using a Cu—Mn alloy, in which case manganese oxide formed at the interface with an insulator containing oxygen has a function of preventing Cu diffusion.

The battery 740 is a secondary battery whose continuous use time can be restored by charging, and an all-solid-state battery including a solid electrolyte.

In addition, the battery 740 can be fabricated with the use of a semiconductor manufacturing process. Note that the semiconductor manufacturing process refers to methods in general that are used for manufacturing semiconductor devices, such as a film formation process, a crystallization process, a plating process, a cleaning process, a lithography process, an etching process, a polishing process, an impurity implantation process, or a heat treatment process.

The details of the battery 740 will be described later in Embodiment 5.

The insulating film 741 can be formed to have a single-layer structure or a stacked-layer structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

In the case where the battery 740 includes lithium, the insulating film 741 preferably has a function of preventing (blocking) diffusion of lithium. When lithium included in the battery 740 enters a semiconductor element (the transistor 720 or the transistor 730) as a movable ion, the semiconductor element deteriorates. With the insulating film 741 blocking lithium ions, a highly reliable semiconductor device can be provided.

In the case where the battery 740 includes lithium, the insulating film 741 preferably includes a halogen such as fluorine, chlorine, bromine, or iodine. When the insulating film 741 includes a halogen, the halogen is easily combined with lithium, which is an alkali metal. Then, lithium is fixed in the insulating film 741, whereby diffusion of lithium to the outside of the insulating film 741 can be prevented.

In the case where the insulating film 741 is formed of silicon nitride by a chemical vapor deposition (CVD) method, for example, when a halogen-containing gas is mixed in a source gas at 3% to 6% (volume ratio), e.g., at 5%, the obtained silicon nitride film includes the halogen. The concentration of the halogen element included in the insulating film 741, measured by secondary ion mass spectrometry (SIMS), is greater than or equal to $1\times10^{17}$ atoms/$cm^3$, preferably greater than or equal to $1\times10^{18}$ atoms/$cm^3$, and more preferably greater than or equal to $1\times10^{19}$ atoms/$cm^3$.

The insulating film 742 has a function of protecting the battery 740. As the insulating film 742, for example, an insulating material such as a resin (e.g., a polyimide resin, a polyamide resin, an acrylic resin, a siloxane resin, an epoxy resin, or a phenol resin), glass, an amorphous compound, or ceramics can be used. Furthermore, a layer containing calcium fluoride or the like may be provided as a water absorption layer between resin layers. The insulating film 742 can be formed by a spin coating method, an ink-jet method, or the like. Alternatively, the insulating film 742 can be formed to have a single-layer structure or a stacked-layer structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, lanthanum oxide, gallium oxide, lanthanum oxide, cesium oxide, tantalum oxide, and magnesium oxide.

The semiconductor device 1000 may further include a semiconductor element over the battery 740. In that case, the insulating film 742 preferably has a function of preventing (blocking) diffusion of lithium, like the insulating film 741. With the insulating film 742 blocking lithium, a highly reliable semiconductor device can be provided.

In the case where a semiconductor element is formed over the battery 740, the insulating film 742 preferably includes a halogen such as fluorine, chlorine, bromine, or iodine, like the insulating film 741. With the insulating film 742 including a halogen, the halogen is easily combined with lithium, which is an alkali metal, whereby diffusion of lithium to the outside of the insulating film 742 can be prevented.

In FIGS. 9 to 11, regions where reference numerals and hatching patterns are not given show regions formed of an insulator. These regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, in these regions, an organic resin such as a polyimide resin, a polyamide resin, an acrylic resin, a siloxane resin, an epoxy resin, or a phenol resin can be used.

The semiconductor device 1000 in FIG. 9 preferably includes a cooling device such as a heat sink, a water-cooling cooler, or a cooling fan over the battery 740. The provision of the cooling device can prevent a malfunction of the semiconductor device 1000 caused by heat generation of the battery 740.

<Example 2 of Cross-Sectional View>

Although the transistor 720 in FIG. 9 is a planar transistor, the form of the transistor 720 is not limited thereto. For example, a FIN-type transistor, a TRI-GATE transistor or the like can be used. An example of a cross-sectional view in that case is shown in FIG. 10.

A semiconductor device 1100 shown in FIG. 10 is different from the semiconductor device 1000 in FIG. 9 in that it includes FIN-type transistors 750 provided over the substrate 700. In FIG. 10, the transistor 750 on the left side is a cross-sectional view in the channel length direction of the transistor, and the transistor 750 on the right side is a cross-sectional view in the channel width direction of the transistor.

In FIG. 10, an insulating film 757 is provided over the substrate 700. The substrate 700 includes a protruding portion with a thin tip (also referred to a fin). Note that an insulating film may be provided over the protruding portion. The insulating film functions as a mask for preventing the substrate 700 from being etched when the projecting portion is formed. Alternatively, the protruding portion may not have the thin tip; a protruding portion with a cuboid-like protruding portion and a protruding portion with a thick tip are permitted, for example. A gate insulating film 754 is provided over the protruding portion of the substrate 700, and a gate electrode 756 and a sidewall insulating layer 755 are formed thereover. In the substrate 700, an impurity region 751 functioning as a source region or a drain region, an impurity region 752 functioning as an LDD region or an extension region, and a channel formation region 753 are formed. Note that here is shown an example in which the substrate 700 includes the protruding portion; however, a semiconductor device of one embodiment of the present invention is not limited thereto. For example, a semiconductor region having a protruding portion may be formed by processing an SOI substrate.

For the other components of the semiconductor device 1100, the description of the semiconductor device 1000 is referred to.

The structures and methods described in this embodiment can be implemented by being combined as appropriate with any of the other structures and methods described in the other embodiments.

Embodiment 5

In this embodiment, structure examples of batteries 740A to 740D, which can be used as the battery 740 described in Embodiment 4, are described using top views and cross-sectional views.

<Structure Example 1 of Battery>

Figure 12A:
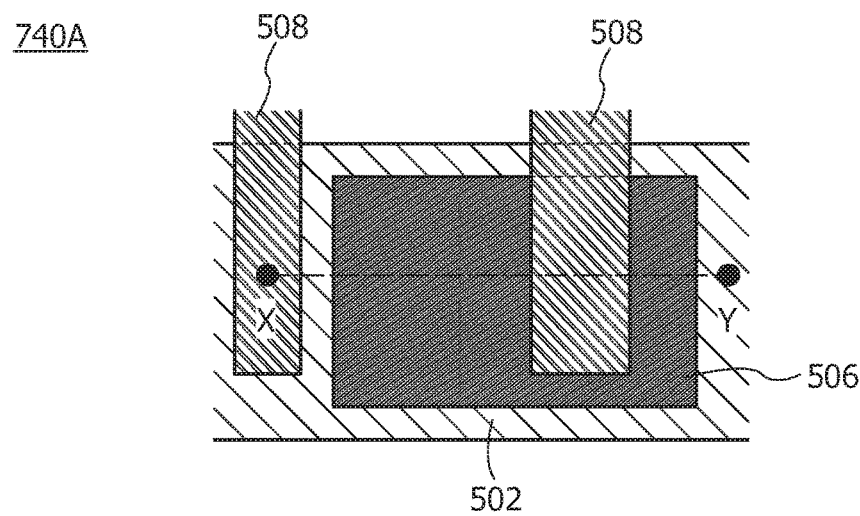
FIGS. 12A and 12B are a top view and a cross-sectional view illustrating one embodiment of the present invention.
Figure 12B:
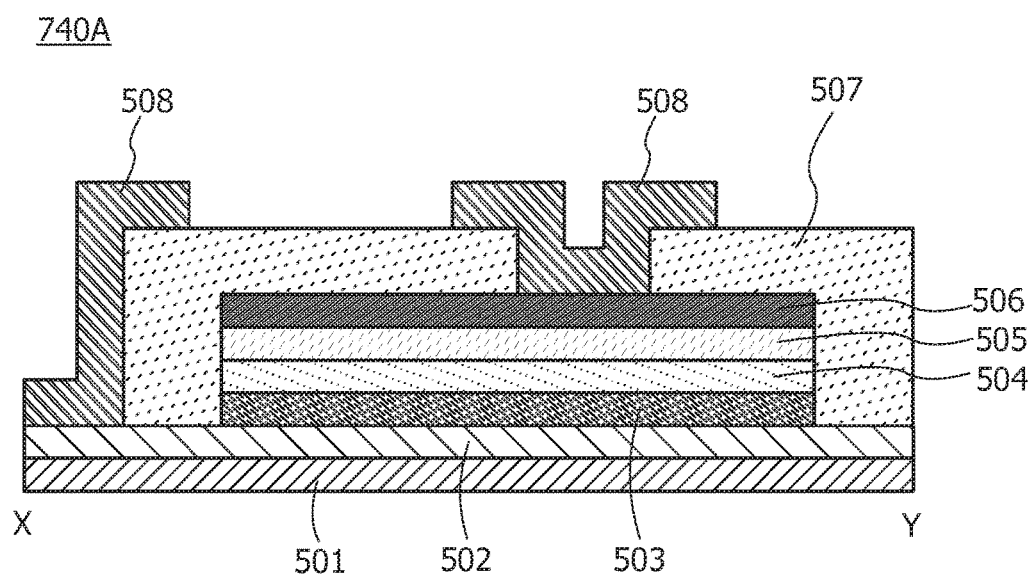

FIG. 12A is a top view of the battery 740A, and FIG. 12B shows a cross-sectional view taken along the dashed-dotted line X-Y in FIG. 12A. In FIG. 12A, some components are enlarged, reduced in size, or omitted for easy understanding.

The battery 740A shown in FIG. 12A includes an insulating film 501, a positive electrode current collector layer 502 over the insulating film 501, a positive electrode active material layer 503 over the positive electrode current collector layer 502, a solid electrolyte layer 504 over the positive electrode active material layer 503, a negative electrode active material layer 505 over the solid electrolyte layer 504, and a negative electrode current collector layer 506 over the negative electrode active material layer 505. The positive electrode current collector layer 502 and the positive electrode active material layer 503 function as a positive electrode, and the negative electrode current collector layer 506 and the negative electrode active material layer 505 function as a negative electrode. In addition, an insulating film 507 is formed at least over the negative electrode current collector layer 506, and a wiring 508 is formed in an opening portion of the insulating film 507. The wiring 508 is electrically connected to the positive electrode current collector layer 502 or the negative electrode current collector layer 506.

Although not shown in the drawing, a lithium layer may be formed at the interface between the solid electrolyte layer 504 and the positive electrode active material layer 503 or at the interface between the solid electrolyte layer 504 and the negative electrode active material layer 505. The lithium layer is for supplying (or predoping) lithium serving as a carrier to the positive electrode active material layer or the negative electrode active material layer in the battery 740A. The lithium layer may be formed over the entire surface of a layer over which the lithium layer is to be formed. Furthermore, a copper layer or a nickel layer may be formed in contact with the lithium layer. The copper layer or the nickel layer has a shape substantially the same as that of the lithium layer. The copper layer or the nickel layer can function as a current collector when the positive electrode active material layer or the negative electrode active material layer is predoped with lithium from the lithium layer.

Note that the predoping may be performed so that all the lithium included in the lithium layer is doped to the positive electrode active material layer or the negative electrode active material layer or so that part of the lithium layer is left after the predoping. The part of the lithium layer left after the predoping can be used to compensate lithium lost by irreversible capacity due to charge and discharge of the battery.

For the details of the insulating film 501, the description regarding the insulating film 741 in Embodiment 4 may be referred to.

The positive electrode current collector layer 502, the positive electrode active material layer 503, the negative electrode active material layer 505, and the negative electrode current collector layer 506 can be formed by a sputtering method, a CVD method, nanoimprint lithography, an evaporation method, or the like. When a sputtering method is used, it is preferable to use a DC power supply rather than an RF power supply for deposition. A sputtering method using a DC power supply is preferable because the deposition rate is high and thus cycle time is short. The thickness of each of the positive electrode current collector layer 502, the positive electrode active material layer 503, the negative electrode active material layer 505, and the negative electrode current collector layer 506 may be greater than or equal to 100 nm and less than or equal to 100 μm, for example.

The positive electrode current collector layer 502 may be formed to have a single-layer or stacked-layer structure using one or more of titanium (Ti), aluminum (Al), gold (Au), and platinum (Pt). Alternatively, a single-layer or stacked-layer conductive film including an alloy of the above metals or a compound containing any of these as a main component may be used.

The positive electrode active material layer 503 may be formed to have a single-layer or stacked-layer structure using one or more of lithium cobaltate, lithium iron phosphate, lithium manganite, lithium nickelate, and vanadium oxide.

Furthermore, the positive electrode active material layer 503 may be formed using an olivine-type lithium-containing complex phosphate. Typical examples of a lithium-containing complex phosphate ($LiMPO_4$ (general formula) (M is one or more of Fe(II), Mn(II), Co(II), and Ni(II))) are LiFePO$_4$, LiNiPO$_4$, LiCoPO$_4$, LiMnPO$_4$, LiFe$_a$Ni$_b$PO$_4$, LiFe$_a$Co$_b$PO$_4$, LiFe$_a$Mn$_b$PO$_4$, LiNi$_a$Co$_b$PO$_4$, LiNi$_a$Mn$_b$PO$_4$ (a+b≤0<a<1, and 0<b<1), LiFe$_c$Ni$_d$Co$_e$PO$_4$, LiFe$_c$Ni$_d$Mn$_e$PO$_4$, LiNi$_c$Co$_d$Mn$_e$PO$_4$ (c+d+e≤1, 0<c<1, 0<d<1, and 0<e<1), LiFe$_f$Ni$_g$Co$_h$Mn$_i$PO$_4$ (f+g+h+i≤1, 0<f<1, 0<g<1, 0<h<1, and 0<i<1), and the like.

An inorganic solid electrolyte that can be formed by a sputtering method, an evaporation method, or a CVD method is used for the solid electrolyte layer 504. Examples of the inorganic solid electrolyte are a sulfide-based solid electrolyte and an oxide-based solid electrolyte.

Examples of the sulfide-based solid electrolyte are lithium complex sulfide materials such as Li$_7$P$_3$S$_{11}$, Li$_{3.25}$P$_{0.95}$S$_4$, Li$_{10}$GeP$_2$S$_{12}$, Li$_{3.25}$Ge$_{0.25}$P$_{0.75}$S$_4$, Li$_2$S—P$_2$S$_5$, Li$_2$S—GeS$_2$, Li$_2$S—SiS$_2$—Li$_3$PO$_4$, Li$_2$S—SiS$_2$—Ga$_2$S$_3$, Li$_2$S—SiS$_2$—Li$_4$SiO$_4$, LiI—Li$_2$S—P$_2$S$_5$, LiI—Li$_2$S—B$_2$S$_3$, and LiI—Li$_2$S—SiS$_2$.

Examples of the oxide-based solid electrolyte are lithium complex oxides and lithium oxide materials, such as Li$_{1.3}$Al$_{0.3}$Ti$_{1.7}$(PO$_4$)$_3$, Li$_{1.07}$Al$_{0.69}$Ti$_{1.46}$(PO$_4$)$_3$, Li$_4$SiO$_4$—Li$_3$BO$_3$, Li$_{2.9}$PO$_{3.3}$N$_{0.46}$, Li$_{3.6}$Si$_{0.6}$P$_{0.4}$O$_4$, Li$_{1.5}$Al$_{0.5}$Ge$_{1.6}$(PO$_4$)$_3$, Li$_2$O, Li$_2$CO$_3$, Li$_2$MoO$_4$, Li$_3$PO$_4$, Li$_3$VO$_4$, Li$_4$SiO$_4$, LLT(La$_{2/3-x}$Li$_{3x}$TiO$_3$), and LLZ(Li$_7$La$_3$Zr$_2$O$_{12}$).

Alternatively, a polymer solid electrolyte such as polyethylene oxide (PEO) formed by a coating method or the like may be used for the solid electrolyte layer 504. Still alternatively, a composite solid electrolyte containing any of the above inorganic solid electrolytes and a polymer solid electrolyte may be used.

The negative electrode active material layer 505 may be formed to have a single-layer or stacked-layer structure using one or more of carbon (C), silicon (Si), germanium (Ge), tin (Sn), aluminum (Al), lithium (Li), lithium titanium oxide, lithium niobate, niobium oxide, tantalum oxide, and silicon oxide.

The negative electrode current collector layer 506 may be formed to have a single-layer or stacked-layer structure using one or more of titanium (Ti), copper (Cu), stainless steel, iron (Fe), gold (Au), platinum (Pt), and nickel (Ni). Alternatively, a single-layer or stacked-layer conductive film including an alloy of the above metals or a compound containing any of these as a main component may be used.

For the details of the insulating film 507, the description regarding the insulating film 742 in Embodiment 4 may be referred to.

For the details of the wiring 508, the description regarding the wiring 707 in Embodiment 4 may be referred to.

For the battery 740A, the positions of the positive electrode and the negative electrode shown in FIG. 12B may be reversed. That is to say, the negative electrode current collector layer 506, the negative electrode active material layer 505, the solid electrolyte layer 504, the positive electrode active material layer 503, and the positive electrode current collector layer 502 may be formed in this order from the bottom.

For example, in the case where LiFePo$_4$ with a thickness of 1 μm is used for the positive electrode active material layer 503, the capacity of the battery 740A obtained by calculation is approximately 60 μAh/cm$^2$.

For example, in the case where LiCoO$_2$ with a thickness of 1 μm is used for the positive electrode active material layer 503, the capacity of the battery 740A obtained by calculation is approximately 70 μAh/cm$^2$.

For example, in the case where LiMn$_2$O$_4$ with a thickness of 1 μm is used for the positive electrode active material layer 503, the capacity of the battery 740A obtained by calculation is approximately 60 μAh/cm$^2$.

Note that each of the above calculations uses the theoretical capacity of the positive electrode active material (i.e., 170 mAh/g for LiFePo$_4$, 137 mAh/g for LiCoO$_2$, and 148 mAh/g for LiMn$_2$O$_4$), supposing that lithium is used for the negative electrode active material layer 505.

The area and capacity of the battery 740A is determined in accordance with the amount of electric power required to hold the potential of the back gate. In the case where LiFePo$_4$ is used for the positive electrode active material layer 503, for example, by making the area of the battery 740A (the area where the positive electrode active material layer 503 and the negative electrode active material layer 505 overlap with each other) greater than or equal to 0.01 cm$^2$ and less than or equal to 1 cm$^2$, the capacity of the battery 740A can be greater than or equal to 0.6 μAh and less than or equal to 60 μAh, according to the above calculation results.

Furthermore, in accordance with the amount of electric power required to hold the potential of the back gate connected to the battery, a plurality of batteries 740A may be connected in series and/or in parallel. In particular, connecting a plurality of stacked batteries 740A in series and/or in parallel is preferable because the energy density of the battery can be increased while the area occupied by the battery can be reduced.

The positive electrode active material layer 503 and the negative electrode active material layer 505 may each include a binder for improving adhesion of active materials as necessary.

It is preferable for the binder to include, for example, water-soluble polymers. As the water-soluble polymers, a polysaccharide or the like can be used. As the polysaccharide, a cellulose derivative such as carboxymethyl cellulose (CMC), methyl cellulose, ethyl cellulose, hydroxypropyl cellulose, diacetyl cellulose, or regenerated cellulose, starch, or the like can be used.

As the binder, a rubber material such as styrene-butadiene rubber (SBR), styrene-isoprene-styrene rubber, acrylonitrile-butadiene rubber, butadiene rubber, or ethylene-propylene-diene copolymer is preferably used. Any of these rubber materials is more preferably used in combination with the aforementioned water-soluble polymers.

Alternatively, as the binder, a material such as polystyrene, poly(methyl acrylate), poly(methyl methacrylate) (PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, isobutylene, polyethylene terephthalate, nylon, polyvinylidene fluoride (PVDF), or polyacrylonitrile (PAN) can be preferably used.

Two or more of the above materials may be used in combination for the binder.

Furthermore, the positive electrode active material layer 503 and the negative electrode active material layer 505 may each include a conductive additive or the like for improving the conductivity of the active material layers.

Examples of the conductive additive include natural graphite, artificial graphite such as mesocarbon microbeads, and carbon fiber. Examples of carbon fiber include mesophase pitch-based carbon fiber, isotropic pitch-based carbon fiber, carbon nanofiber, and carbon nanotube. Carbon nanotube can be formed by, for example, a vapor deposition method. Other examples of the conductive additive include carbon materials such as carbon black (acetylene black (AB)) and graphene. Alternatively, metal powder or metal fibers of copper, nickel, aluminum, silver, gold, or the like, a conductive ceramic material, or the like can be used.

Flaky graphene has an excellent electrical characteristic of high conductivity and excellent physical properties of high flexibility and high mechanical strength. Thus, the use of graphene as the conductive additive can increase contact points and the contact area of active materials.

Note that graphene in this specification includes single-layer graphene and multilayer graphene including two to hundred layers. Single-layer graphene refers to a one-atom-thick sheet of carbon molecules having π bonds. Graphene oxide refers to a compound formed by oxidation of such graphene. When graphene oxide is reduced to form graphene, oxygen contained in the graphene oxide is not entirely released and part of oxygen remains in the graphene. In the case where the graphene contains the part of oxygen, the proportion of the oxygen measured by X-ray photoelectron spectroscopy (XPS) is higher than or equal to 2% and lower than or equal to 20%, preferably higher than or equal to 3% and lower than or equal to 15% of the whole graphene.

A separator may be provided in the solid electrolyte layer 504 to prevent short-circuiting between the positive electrode and the negative electrode, as necessary. As the separator, an insulator with pores is preferably used. For example, cellulose; a glass fiber; ceramics; or a synthetic fiber containing nylon (polyamide), vinylon (polyvinyl alcohol based fiber), polyester, acrylic, polyolefin, or polyurethane; can be used.

<Structure Example 2 of Battery>

Figure 13A:
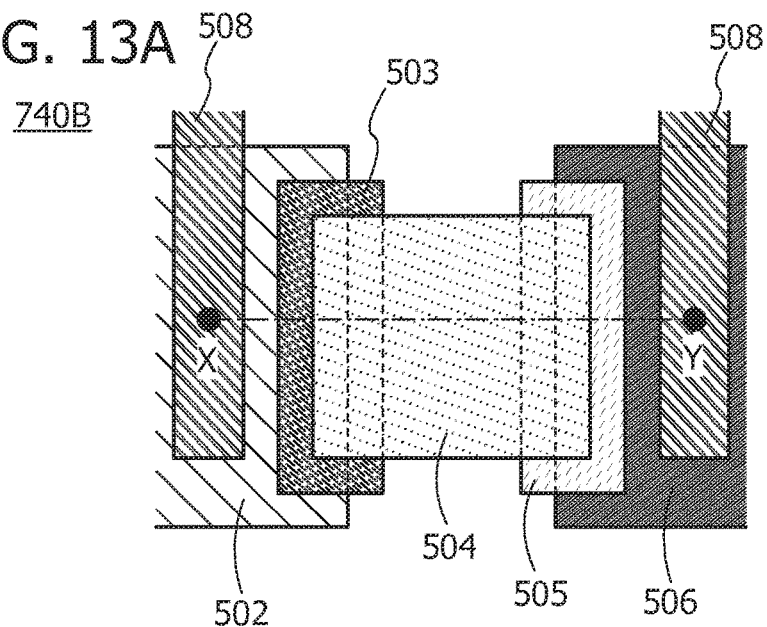
FIGS. 13A and 13B are a top view and a cross-sectional view illustrating one embodiment of the present invention.
Figure 13B:
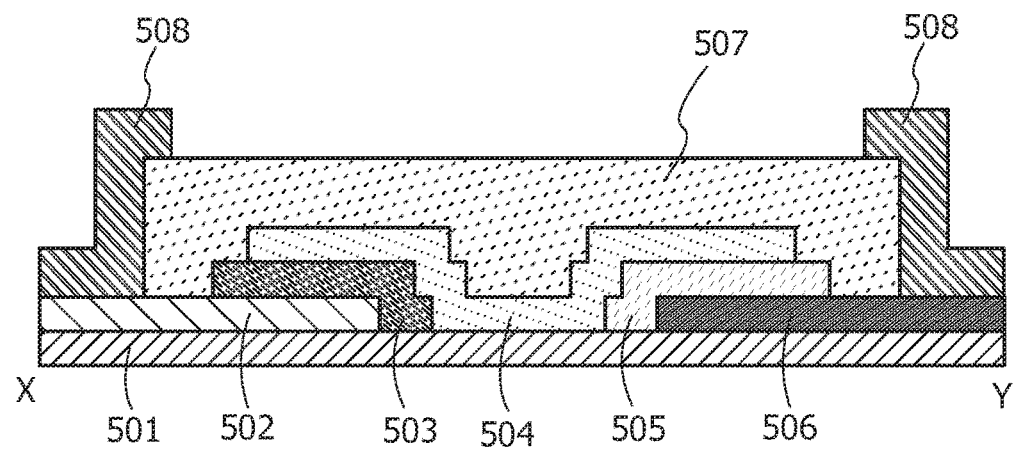

FIGS. 13A and 13B show an example of the battery included in one embodiment of the present invention. FIG. 13A is a top view of the battery 740B, and FIG. 13B shows a cross-sectional view taken along the dashed-dotted line X-Y in FIG. 13A. In FIG. 13A, some components are enlarged, reduced in size, or omitted for easy understanding.

The battery 740B shown in FIG. 13B includes an insulating film 501; a positive electrode current collector layer 502 and a negative electrode current collector layer 506, which are level with each other and are arranged over the insulating film 501; a positive electrode active material layer 503 over the positive electrode current collector layer 502; a negative electrode active material layer 505 over the negative electrode current collector layer 506; and a solid electrolyte layer 504 in contact with at least the positive electrode active material layer 503 and the negative electrode active material layer 505. The positive electrode current collector layer 502 and the positive electrode active material layer 503 function as a positive electrode, and the negative electrode current collector layer 506 and the negative electrode active material layer 505 function as a negative electrode. In addition, an insulating film 507 is formed at least over the solid electrolyte layer 504, and a wiring 508 is formed in an opening portion of the insulating film 507. The wiring 508 is electrically connected to the positive electrode current collector layer 502 or the negative electrode current collector layer 506.

The battery 740B is different from the battery 740A in FIGS. 12A and 12B in that the positive electrode current collector layer 502 and the negative electrode current collector layer 506 are level with each other and the positive electrode and the negative electrode exist in the X-Y direction of FIG. 13B. The structure of the battery 740B shown in FIG. 13B makes it possible to provide a certain distance between the positive electrode and the negative electrode, whereby short-circuiting between the positive electrode and the negative electrode can be prevented.

For the details regarding the components of the battery 740B, the description of the battery 740A in FIGS. 12A and 12B may be referred to.

The positive electrode current collector layer 502 and the negative electrode current collector layer 506 in the battery 740B may be formed using the same materials, at a time. Formation of the positive and negative electrode current collector layers using the same material at the same time can simplify the manufacturing process.

<Structure Example 3 of Battery>

Figure 14A:
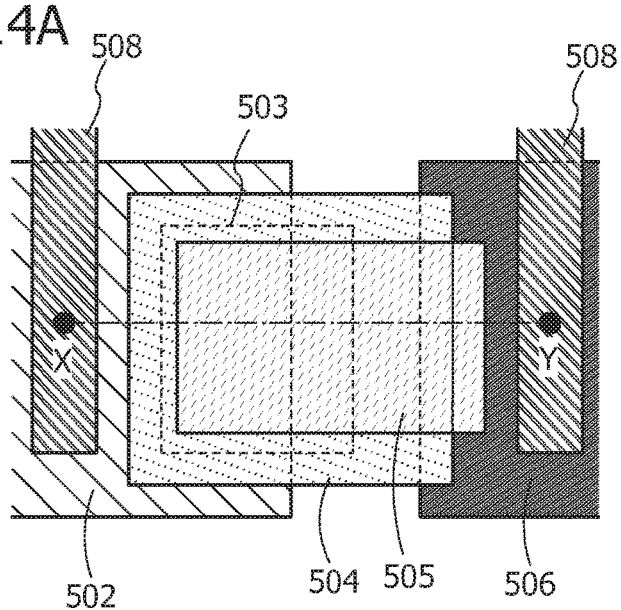
FIGS. 14A and 14B are a top view and a cross-sectional view illustrating one embodiment of the present invention.
Figure 14B:
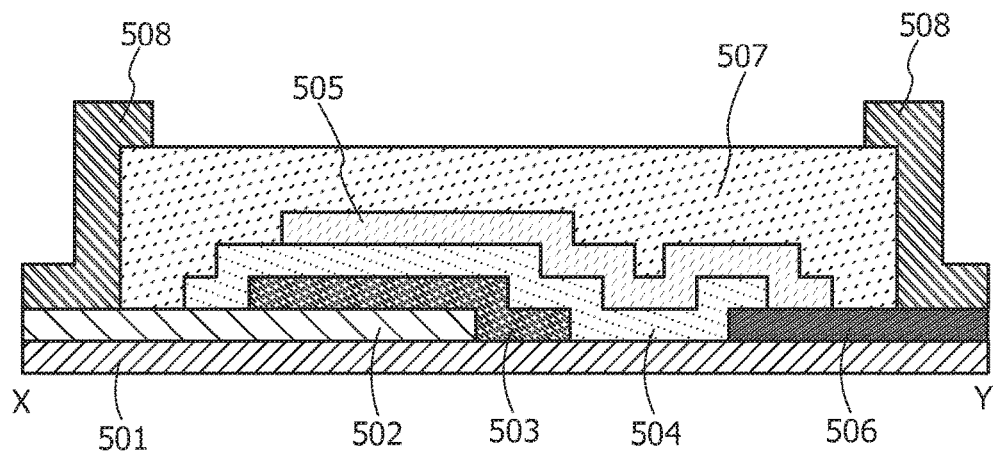

FIGS. 14A and 14B show an example of the battery included in one embodiment of the present invention. FIG. 14A is a top view of the battery 740C, and FIG. 14B shows a cross-sectional view taken along the dashed-dotted line X-Y in FIG. 14A. In FIG. 14A, some components are enlarged, reduced in size, or omitted for easy understanding.

The battery 740C shown in FIG. 14B includes an insulating film 501; a positive electrode current collector layer 502 and a negative electrode current collector layer 506, which are level with each other and are arranged over the insulating film 501; a positive electrode active material layer 503 over the positive electrode current collector layer 502; a solid electrolyte layer 504 over the positive electrode active material layer 503, the insulating film 501, and the negative electrode current collector layer 506; and a negative electrode active material layer 505, which overlaps with part of the positive electrode active material layer 503 with the solid electrolyte layer 504 positioned therebetween and is arranged over the solid electrolyte layer 504 and the negative electrode current collector layer 506. The positive electrode current collector layer 502 and the positive electrode active material layer 503 function as a positive electrode, and the negative electrode current collector layer 506 and the negative electrode active material layer 505 function as a negative electrode. In addition, an insulating film 507 is formed at least over the negative electrode active material layer 505, and a wiring 508 is formed in an opening portion of the insulating film 507. The wiring 508 is electrically connected to the positive electrode current collector layer 502 or the negative electrode current collector layer 506.

The battery 740C shown in FIG. 14B is different from the battery 740A shown in FIG. 12B in that the negative electrode active material layer 505 is formed over the solid electrolyte layer 504. The structure of the battery 740C shown in FIG. 14B makes it possible to provide a certain distance between the positive electrode current collector layer 502 and the negative electrode current collector layer 506 for preventing short-circuiting, and to shorten the distance between the positive electrode active material layer 503 and the negative electrode active material layer 505 for facilitating the efficient movement of ions.

For the details regarding the components of the battery 740C, the description of the battery 740A in FIGS. 12A and 12B may be referred to.

For the battery 740C, the positions of the positive electrode and the negative electrode may be reversed. That is to say, the negative electrode active material layer 505, the solid electrolyte layer 504, and the positive electrode active material layer 503 may be formed in this order from the bottom.

Furthermore, the positive electrode current collector layer 502 and the negative electrode current collector layer 506 in the battery 740C may be formed using the same material at the same time. Formation of the positive and negative electrode current collector layers using the same material at the same time can simplify the manufacturing process.

<Structure Example 4 of Battery>

Figure 15A:
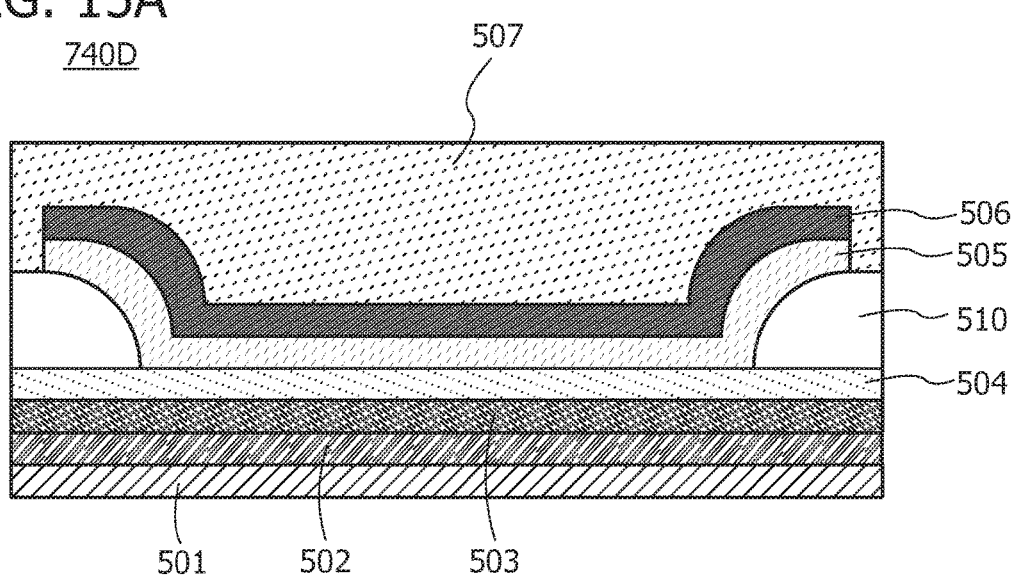
FIGS. 15A and 15B are cross-sectional views each illustrating one embodiment of the present invention.
Figure 15B:
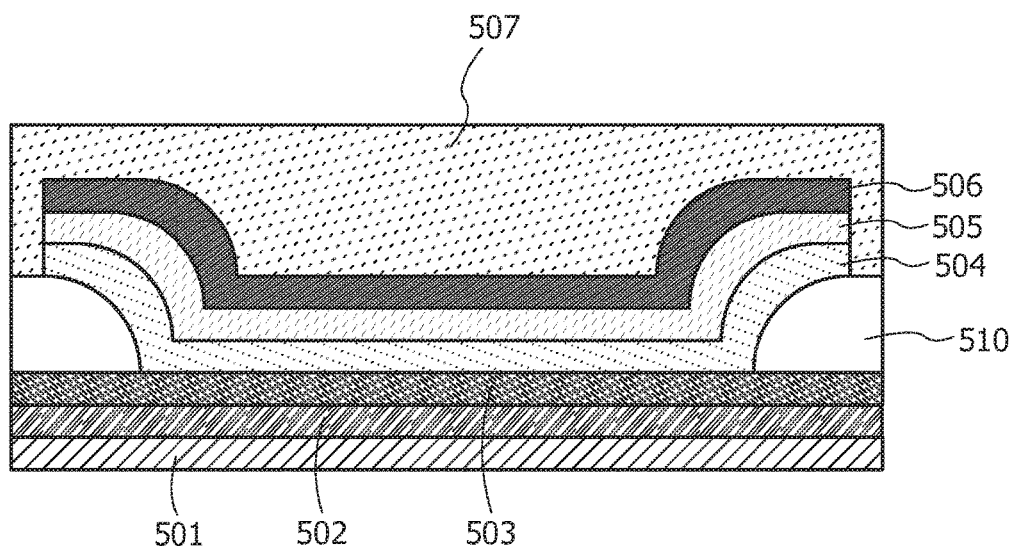

An example of the battery included in one embodiment of the present invention is shown in each of FIGS. 15A and 15B. FIG. 15A is a cross-sectional view of the battery 740D.

The battery 740D shown in FIG. 15A includes an insulating film 501, a positive electrode current collector layer 502 over the insulating film 501, a positive electrode active material layer 503 over the positive electrode current collector layer 502, a solid electrolyte layer 504 over the positive electrode active material layer 503, an insulating film 510 over the solid electrolyte layer 504, a negative electrode active material layer 505 over the solid electrolyte layer 504 and the insulating film 510, and a negative electrode current collector layer 506 over the negative electrode active material layer 505. The positive electrode current collector layer 502 and the positive electrode active material layer 503 function as a positive electrode, and the negative electrode current collector layer 506 and the negative electrode active material layer 505 function as a negative electrode. In addition, an insulating film 507 is formed at least over the negative electrode current collector layer 506. Although not shown in the drawing, the positive electrode current collector layer 502 and the negative electrode current collector layer 506 are each electrically connected to an external device via a wiring.

In the battery 740D shown in FIG. 15A, a region where the solid electrolyte layer 504 and the negative electrode active material layer 505 are in contact with each other functions as a battery, and, in a region that does not function as a battery, the insulating film 510 is present between the solid electrolyte layer 504 and the negative electrode active material layer 505. This structure can prevent short-circuiting between the positive electrode and the negative electrode.

The insulating film 510 can be formed using, for example, an organic resin or an inorganic insulating material. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the insulating film 510. There is no particular limitation on the method for forming the insulating film 510. A photolithography method, a sputtering method, an evaporation method, a droplet discharging method (e.g., an inkjet method), a printing method (e.g., a screen printing method or an offset printing method), or the like can be used.

For the other components of the battery 740D, the description of the battery 740A in FIGS. 12A and 12B may be referred to.

In the battery 740D, the insulating film 510 may be formed over the positive electrode active material layer 503 as shown in FIG. 15B.

For the battery 740D shown in FIGS. 15A and 15B, the positions of the positive electrode and the negative electrode may be reversed. That is to say, the negative electrode current collector layer 506, the negative electrode active material layer 505, the solid electrolyte layer 504, the positive electrode active material layer 503, and the positive electrode current collector layer 502 may be formed in this order from the bottom.

The structures and methods described in this embodiment can be implemented by being combined as appropriate with any of the other structures and methods described in the other embodiments.

Embodiment 6

In this embodiment, the transistor 730 (OS transistor) including an oxide semiconductor in a semiconductor layer, which is mentioned in Embodiment 4, will be described with reference to drawings. Note that the OS transistor described in this embodiment is an example, and the form of a transistor that can be used for the invention is not limited thereto.

<Structure Example of Oxide Semiconductor Transistor>

FIGS. 16A to 16D are a top view and cross-sectional views of the transistor 730. FIG. 16A is the top view. FIG. 16B corresponds to a cross section along the dashed-dotted line Y1-Y2 in FIG. 16A. FIG. 16C corresponds to a cross section along the dashed-dotted line X1-X2 in FIG. 16A. FIG. 16D corresponds to a cross section along the dashed-dotted line X3-X4 in FIG. 16A. In FIGS. 16A to 16D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The transistor 730 includes an insulating film 651 over a substrate 640; a gate electrode 674 over the insulating film 651; an insulating film 652 over the gate electrode 674; a stack over the insulating film 652 in which a first oxide semiconductor 661 and a second oxide semiconductor 662 are formed in this order; a source electrode 671 and a drain electrode 672 electrically connected to part of the stack; a third oxide semiconductor 663 that covers part of the stack, part of the source electrode 671, and part of the drain electrode 672; a gate insulating film 653 and a gate electrode 673 that cover part of the stack, part of the source electrode 671, part of the drain electrode 672, and the third oxide semiconductor 663; an insulating film 654 over the source electrode 671, the drain electrode 672, and the gate electrode 673; and an insulating film 655 over the insulating film 654. Note that the first oxide semiconductor 661, the second oxide semiconductor 662, and the third oxide semiconductor 663 are collectively referred to as an oxide semiconductor 660.

Note that at least part (or all) of the source electrode 671 (and/or the drain electrode 672) is provided on at least part (or all) of a surface, a side surface, a top surface, and/or a bottom surface of a semiconductor layer such as the second oxide semiconductor 662 (and/or the first oxide semiconductor 661).

Alternatively, at least part (or all) of the source electrode 671 (and/or the drain electrode 672) is in contact with at least part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is in contact with at least part (or all) of a semiconductor layer such as the second oxide semiconductor 662 (and/or the first oxide semiconductor 661).

Alternatively, at least part (or all) of the source electrode 671 (and/or the drain electrode 672) is electrically connected to at least part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is electrically connected to part (or all) of a semiconductor layer such as the second oxide semiconductor 662 (and/or the first oxide semiconductor 661).

Alternatively, at least part (or all) of the source electrode 671 (and/or the drain electrode 672) is provided near part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided near part (or all) of a semiconductor layer such as the second oxide semiconductor 662 (and/or the first oxide semiconductor 661).

Alternatively, at least part (or all) of the source electrode 671 (and/or the drain electrode 672) is provided next to part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided next to part (or all) of a semiconductor layer such as the second oxide semiconductor 662 (and/or the first oxide semiconductor 661).

Alternatively, at least part (or all) of the source electrode 671 (and/or the drain electrode 672) is provided obliquely above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided obliquely above part (or all) of a semiconductor layer such as the second oxide semiconductor 662 (and/or the first oxide semiconductor 661).

Alternatively, at least part (or all) of the source electrode 671 (and/or the drain electrode 672) is provided above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided above part (or all) of a semiconductor layer such as the second oxide semiconductor 662 (and/or the first oxide semiconductor 661).

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

The transistor of one embodiment of the present invention has a top-gate structure with a channel length of greater than or equal to 10 nm and less than or equal to 1000 nm, preferably greater than or equal to 20 nm and less than or equal to 500 nm, further preferably greater than or equal to 30 nm and less than or equal to 300 nm.

Constituent elements of the semiconductor device of this embodiment will be described below in detail.

<Substrate>

The substrate 640 is not limited to a simple supporting substrate and may be a substrate where a device such as a transistor is formed. In that case, one of the gate electrode 673, the source electrode 671, and the drain electrode 672 of the transistor 730 may be electrically connected to the device.

<Base Insulating Films>

Each of the insulating films 651 and 652 can have a function of supplying oxygen to the oxide semiconductor 660 as well as a function of preventing diffusion of impurities from the substrate 640. For this reason, each of the insulating films 651 and 652 preferably contains oxygen and more preferably has an oxygen content higher than that in the stoichiometric composition. For example, each insulating film is a film in which the amount of released oxygen converted into oxygen atoms is $1.0 \times 10^{19}$ atoms/cm$^3$ or more in TDS analysis. When the substrate 640 is a substrate where a device is formed as described above, the insulating film 652 is preferably subjected to planarization treatment such as chemical mechanical polishing (CMP) treatment so as to have a flat surface. Note that the temperature of the film surface in the TDS analysis is preferably higher than or equal to 100° C. and lower than or equal to 700° C., or higher than or equal to 100° C. and lower than or equal to 500° C.

The insulating films 651 and 652 can be formed using an oxide insulating film of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride oxide, or the like, or a film in which any of the above materials are mixed.

<Oxide Semiconductor>

Typical examples of the oxide semiconductor 660 are an In—Ga oxide, an In—Zn oxide, and In-M-Zn oxide (M represents Ti, Ga, Y, Zr, La, Ce, Nd, Sn, or Hf). In particular, In-M-Zn oxide (M represents Ti, Ga, Y, Zr, La, Ce, Nd, Sn, or Hf) is preferably used as the oxide semiconductor 660.

Note that the oxide semiconductor 660 is not limited to the oxide containing indium. The oxide semiconductor 660 may be, for example, a Zn—Sn oxide or a Ga—Sn oxide.

In the case where the oxide semiconductor 660 is an In-M-Zn oxide (M is Ti, Ga, Y, Zr, La, Ce, Nd, Sn, or Hf) formed by sputtering, it is preferred that the atomic ratio of metal elements of a target used for forming a film of the In-M-Zn oxide satisfy In≥M and Zn≥M. As the atomic ratio of metal elements of such a target, In:M:Zn=1:1:1, In:M:Zn=1:1:1.2, In:M:Zn=3:1:2, and In:M:Zn=2:1:3 are preferable. Note that the atomic ratios of metal elements in the oxide semiconductor 660 vary from those in the sputtering target within an error range of ±40%.

Figure 17A:
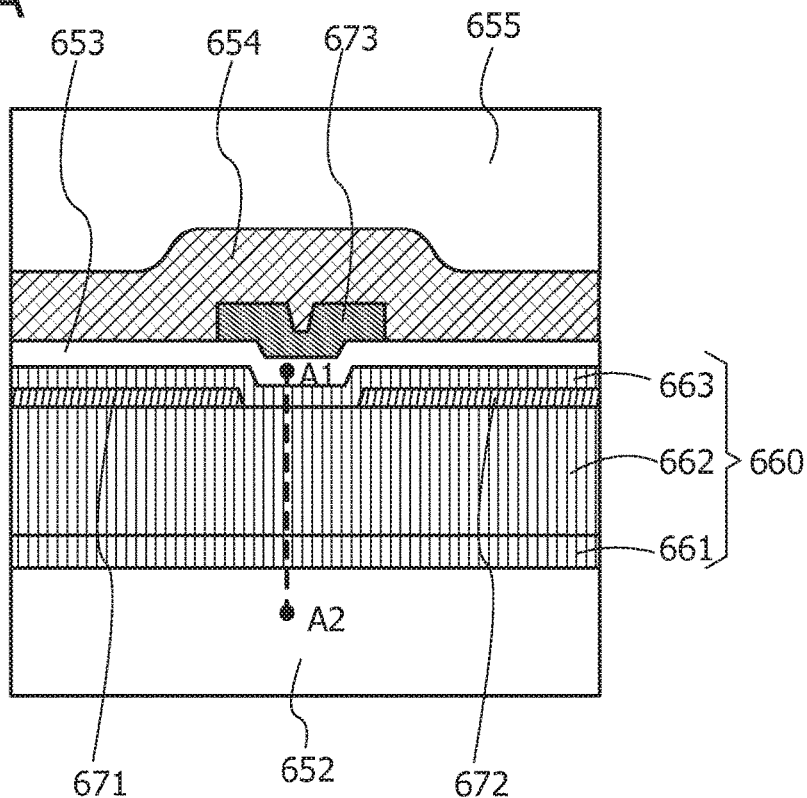
FIGS. 17A and 17B are a top view and an energy band diagram illustrating one embodiment of the present invention.
Figure 17B:
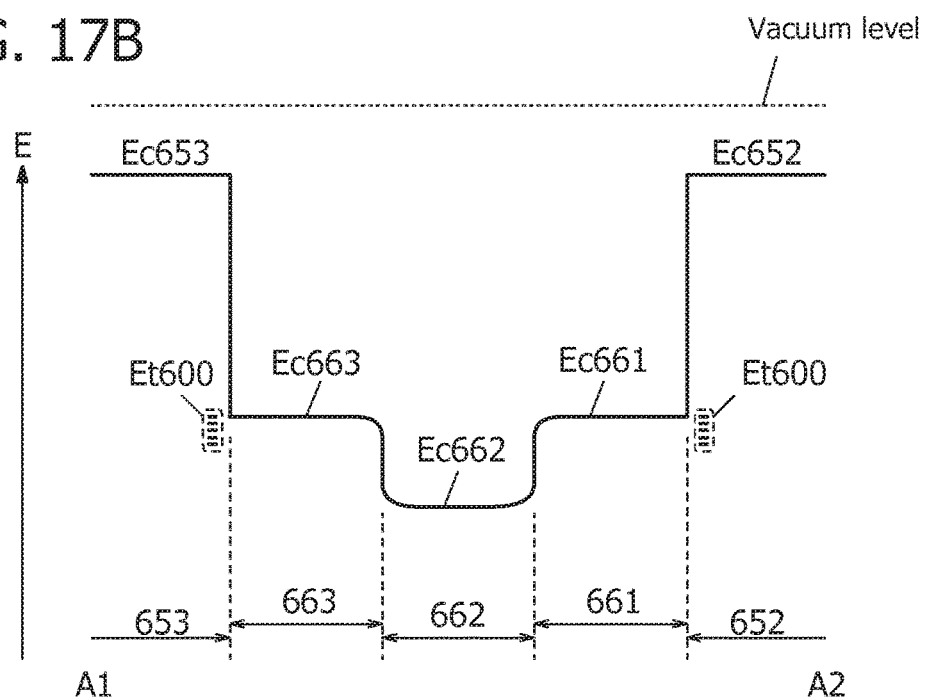

Next, a function and an effect of the oxide semiconductor 660 in which the first oxide semiconductor 661, the second oxide semiconductor 662, and the third oxide semiconductor 663 are stacked will be described using an energy band diagram in FIG. 17B. FIG. 17A is an enlarged view of the channel region of the transistor 730 illustrated in FIG. 16B. FIG. 17B shows an energy band diagram of a portion along the chain line A1-A2 in FIG. 17A. Thus, FIG. 17B illustrates the energy band structure of a channel formation region of the transistor 730.

In FIG. 17B, Ec652, Ec661, Ec662, Ec663, and Ec653 indicate the energy at the bottom of the conduction band of the insulating film 652, the first oxide semiconductor 661, the second oxide semiconductor 662, the third oxide semiconductor 663, and the gate insulating film 653, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide that is formed using a sputtering target having an atomic ratio of In:Ga:Zn=1:3:2 has an energy gap of approximately 3.5 eV and an electron affinity of approximately 4.5 eV. An In—Ga—Zn oxide that is formed using a sputtering target having an atomic ratio of In:Ga:Zn=1:3:4 has an energy gap of approximately 3.4 eV and an electron affinity of approximately 4.5 eV. An In—Ga—Zn oxide that is formed using a sputtering target having an atomic ratio of In:Ga:Zn=1:3:6 has an energy gap of approximately 3.3 eV and an electron affinity of approximately 4.5 eV. An In—Ga—Zn oxide that is formed using a sputtering target having an atomic ratio of In:Ga:Zn=1:6:2 has an energy gap of approximately 3.9 eV and an electron affinity of approximately 4.3 eV. An In—Ga—Zn oxide that is formed using a sputtering target having an atomic ratio of In:Ga:Zn=1:6:8 has an energy gap of approximately 3.5 eV and an electron affinity of approximately 4.4 eV. An In—Ga—Zn oxide that is formed using a sputtering target having an atomic ratio of In:Ga:Zn=1:6:10 has an energy gap of approximately 3.5 eV and an electron affinity of approximately 4.5 eV. An In—Ga—Zn oxide that is formed using a sputtering target having an atomic ratio of In:Ga:Zn=1:1:1 has an energy gap of approximately 3.2 eV and an electron affinity of approximately 4.7 eV. An In—Ga—Zn oxide that is formed using a sputtering target having an atomic ratio of In:Ga:Zn=3:1:2 has an energy gap of approximately 2.8 eV and an electron affinity of approximately 5.0 eV.

Since the insulating film 652 and the gate insulating film 653 are insulators, Ec652 and Ec653 are closer to the vacuum level than Ec661, Ec662, and Ec663 (i.e., the insulating film 652 and the gate insulating film 653 have a smaller electron affinity than the first oxide semiconductor 661, the second oxide semiconductor 662, and the third oxide semiconductor 663).

Ec661 is closer to the vacuum level than Ec662. Specifically, Ec661 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the first oxide semiconductor 661 and the second oxide semiconductor 662 and the interface between the second oxide semiconductor 662 and the third oxide semiconductor 663; thus, the energy at the bottom of the conduction band changes continuously. In other words, no state or few states exist at these interfaces.

Accordingly, electrons transfer mainly through the second oxide semiconductor 662 in the stacked-layer structure having the above energy band. Therefore, even if an interface state exists at the interface between the first oxide semiconductor 661 and the insulating film 652 or the interface between the third oxide semiconductor 663 and the gate insulating film 653, the interface state hardly influences the transfer of electrons. In addition, since no interface state or few interface states exist at the interface between the first oxide semiconductor 661 and the second oxide semiconductor 662 and the interface between the third oxide semiconductor 663 and the second oxide semiconductor 662, the transfer of electrons is not interrupted in the region. Consequently, the transistor 730 including the above stacked oxide semiconductors can have high field-effect mobility.

Although trap states Et600 due to impurities or defects might be formed in the vicinity of the interface between the first oxide semiconductor 661 and the insulating film 652 and the interface between the third oxide semiconductor 663 and the gate insulating film 653 as illustrated in FIG. 17B, the second oxide semiconductor 662 can be separated from the trap states owing to the existence of the first oxide semiconductor 661 and the third oxide semiconductor 663.

In the transistor 730 described in this embodiment, in the channel width direction, the top surface and side surfaces of the second oxide semiconductor 662 are in contact with the third oxide semiconductor 663, and the bottom surface of the second oxide semiconductor 662 is in contact with the first oxide semiconductor 661 (see FIG. 16C). Surrounding the second oxide semiconductor 662 by the first semiconductor 661 and the third oxide semiconductor 663 in this manner can further reduce the influence of the trap states.

However, when the energy difference between Ec662 and Ec661 or Ec663 is small, an electron in the second oxide semiconductor 662 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec661 and Ec662 and between Ec662 and Ec663 is preferably 0.1 eV or more, further preferably 0.15 eV or more, in which case a change in the threshold voltage of the transistor can be reduced and the transistor can have favorable electrical characteristics.

The band gap of each of the first oxide semiconductor 661 and the third oxide semiconductor 663 is preferably wider than that of the second oxide semiconductor 662.

For the first oxide semiconductor 661 and the third oxide semiconductor 663, a material containing Al, Ti, Ga, Ge, Y, Zr, Sn, La, Ce, or Hf with a higher atomic ratio than that used for the second oxide semiconductor 662 can be used, for example. Specifically, any of the above metal elements in an atomic ratio 1.5 times or more, preferably 2 times or more, further preferably 3 times or more as much as a metal element of the second oxide semiconductor 662 is contained. Any of the above metal elements is strongly bonded to oxygen and thus has a function of preventing generation of oxygen vacancy in the oxide semiconductor. That is, an oxygen vacancy is less likely to be generated in the first oxide semiconductor 661 and the third oxide semiconductor 663 than in the second oxide semiconductor 662.

When each of the first oxide semiconductor 661, the second oxide semiconductor 662, and the third oxide semiconductor 663 is an In-M-Zn oxide containing at least indium, zinc, and M (M is a metal such as Al, Ti, Ga, Ge, Y, Zr, Sn, La, Ce, or Hf) and the atomic ratio of In to M and Zn of the first oxide semiconductor 661 is $x_1:y_1:z_1$, that of the second oxide semiconductor 662 is $x_2:y_2:z_2$, and that of the third oxide semiconductor 663 is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. In this case, the transistor can have stable electrical characteristics when $y_2$ is greater than or equal to $x_2$ in the second oxide semiconductor 662. However, when $y_2$ is three times or more as large as $x_2$, the field-effect mobility of the transistor is reduced; accordingly, $y_2$ is preferably smaller than three times $x_2$.

In the case where Zn and O are not taken into consideration, the proportion of In and the proportion of M in the first oxide semiconductor 661 and the third oxide semiconductor 663 are preferably less than 50 atomic % and greater than or equal to 50 atomic %, respectively, and further preferably less than 25 atomic % and greater than or equal to 75 atomic %, respectively. In the case where Zn and O are not taken into consideration, the proportion of In and the proportion of M in the second oxide semiconductor 662 are preferably greater than or equal to 25 atomic % and less than 75 atomic %, respectively, and further preferably greater than or equal to 34 atomic % and less than 66 atomic %, respectively.

The thickness of each of the first oxide semiconductor 661 and the third oxide semiconductor 663 is greater than or equal to 3 nm and less than or equal to 100 nm, preferably greater than or equal to 3 nm and less than or equal to 50 nm. The thickness of the second oxide semiconductor 662 is greater than or equal to 3 nm and less than or equal to 200 nm, preferably greater than or equal to 3 nm and less than or equal to 100 nm, further preferably greater than or equal to 3 nm and less than or equal to 50 nm. The second oxide semiconductor 662 is preferably thicker than the first oxide semiconductor 661 and the third oxide semiconductor 663.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electric characteristics of the transistor. Therefore, it is preferable to reduce the concentration of the impurities in the first oxide semiconductor 661, the second oxide semiconductor 662, and the third oxide semiconductor 663 and at interfaces between the oxide semiconductors.

In order to make the oxide semiconductor intrinsic or substantially intrinsic, for example, the concentration of silicon at a certain depth of the oxide semiconductor or in a certain region of the oxide semiconductor, which is measured by SIMS, is lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen at a certain depth of the oxide semiconductor or in a certain region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen at a certain depth of the oxide semiconductor or in a certain region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Furthermore, the concentration of carbon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which a highly purified oxide semiconductor is used for a channel formation region as described above has an extremely low off-state current. In the case where the voltage between a source and a drain is set to approximately 0.1 V, 5 V, or 10 V, for example, the off-state current standardized on the channel width of the transistor can be as low as several yoctoamperes per micrometer to several zeptoamperes per micrometer.

In the transistor 730 described in this embodiment, the gate electrode 673 is formed to electrically surround the oxide semiconductor 660 in the channel width direction; consequently, a gate electric field is applied to the semiconductor 660 in the side surface direction in addition to the perpendicular direction (see FIG. 16C). In other words, a gate electric field is applied to the whole oxide semiconductor, so that current flows through the entire second oxide semiconductor 662 serving as a channel, leading to a further increase in on-state current.

<Crystal Structure of Oxide Semiconductor>

Next, a structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nano crystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In the cross-sectional TEM image of the CAAC-OS film observed in a direction substantially parallel to the sample surface, metal atoms arranged in a layered manner are seen in the crystal parts. Each metal atom layer has a shape that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "perpendicular" indicates that the angle formed between two straight lines is greater than or equal to $80°$ and less than or equal to $100°$ and accordingly also includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM observation and the plan-view TEM observation, alignment is found in the crystal parts in the CAAC-OS film.

A CAAC-OS film is subjected to structure analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of crystallinity in the vicinity of the top surface is higher than that in the vicinity of the formation surface in some cases. Furthermore, when an impurity is added to the CAAC-OS film, the degree of crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

With the use of the CAAC-OS film in a transistor, variation in the electrical characteristics of the transistor due to irradiation with visible light or ultraviolet light is small.

Furthermore, a transistor including the CAAC-OS film is more resistant to external force, such as deformation due to substrate bending, than a Poly-Si transistor or a single crystal Si transistor, and thus is suitable for a highly flexible substrate such as a plastic substrate.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film by a sputtering method, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target will be described below.

The In—Ga—Zn-based oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 1:4:4, 3:1:2, or 2:1:3. The kinds of powder and the molar ratio for mixing powder may be determined as appropriate depending on the desired target.

<Gate Electrodes>

The gate electrode 673 and the gate electrode 674 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy containing any of these metal element as its component; an alloy containing a combination of any of these metal elements; or the like. The gate electrode 673 and the gate electrode 674 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The gate electrode 673 and the gate electrode 674 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Film>

The gate insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 653 may be a stack including any of the above materials. The gate insulating film 653 may contain lanthanum (La), nitrogen, or zirconium (Zr) as an impurity.

An example of a stacked-layer structure of the gate insulating film 653 will be described. The gate insulating film 653 contains oxygen, nitrogen, silicon, or hafnium, for example. Specifically, the gate insulating film 653 preferably includes hafnium oxide and silicon oxide or silicon oxynitride.

Hafnium oxide has a higher dielectric constant than silicon oxide and silicon oxynitride. Therefore, the thickness of the gate insulating film 653 can be made large as compared with the case where silicon oxide is used; as a result, leakage current due to tunnel current can be small.

That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

<Source Electrode and Drain Electrode>

The source electrode 671 and the drain electrode 672 can be formed using a material used for the gate electrode 673. A Cu—Mn alloy film is preferably used because of its low electrical resistance and because it forms manganese oxide at the interface with the oxide semiconductor 660 and manganese oxide can prevent Cu diffusion.

<Protective Insulating Film>

The insulating film 654 has a function of blocking oxygen, hydrogen, water, alkali metal, alkaline earth metal, and the like. The provision of the insulating film 654 can prevent outward diffusion of oxygen from the oxide semiconductor 660 and entry of hydrogen, water, or the like into the oxide semiconductor 660 from the outside. The insulating film 654 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 660, preventing release of oxygen, which is the main component of the oxide semiconductor 660, from the oxide semiconductor, and preventing unnecessary release of oxygen from the insulating film 652. In addition, oxygen contained in the aluminum oxide film can be diffused into the oxide semiconductor.

<Interlayer Insulating Film>

The insulating film 655 is preferably formed over the insulating film 654. The insulating film 655 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may be a stack of any of the above materials.

The structure and method described in this embodiment can be implemented by being combined as appropriate with any of the other structures and methods described in the other embodiments.

Embodiment 7

In this embodiment, electronic devices of embodiments of the present invention will be described with reference to FIGS. 18A to 18F.

FIGS. 18A to 18F illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

FIG. 18A illustrates a mobile computer, which can include a switch 5009, an infrared port 5010, and the like in addition to the above components. FIG. 18B illustrates a portable image reproducing device (e.g., a DVD player), which is provided with a memory medium and can include a second display portion 5002, a memory medium reading portion 5011, and the like in addition to the above components. FIG. 18C illustrates a goggle-type display, which can include the second display portion 5002, a support 5012, an earphone 5013, and the like in addition to the above components. FIG. 18D illustrates a portable game machine, which can include the memory medium reading portion 5011 and the like in addition to the above components. FIG. 18E illustrates a digital camera, which has a television reception function and can include an antenna 5014, a shutter button 5015, an image receiving portion 5016, and the like in addition to the above components. FIG. 18F illustrates a portable game machine, which can include the second display portion 5002, the memory medium reading portion 5011, and the like in addition to the above components.

The electronic devices illustrated in FIGS. 18A to 18F can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is utilized on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions that can be provided for the electronic devices illustrated in FIGS. 18A to 18F are not limited thereto, and the electronic devices can have a variety of functions.

Each of the electronic devices described in this embodiment incorporates a plurality of batteries and has a wireless receiving portion capable of wireless charging.

Figure 19A:
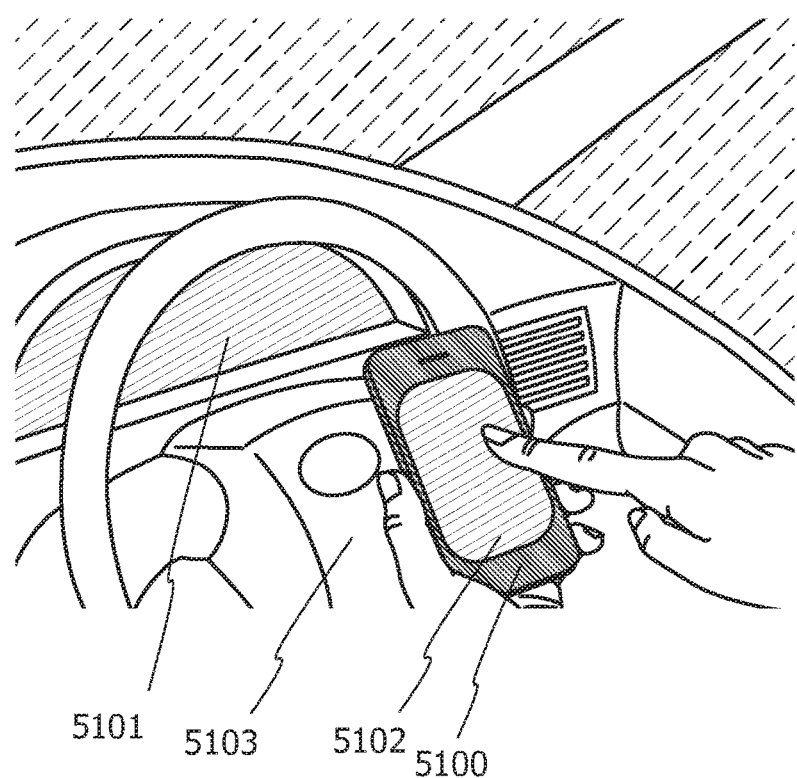
FIGS. 19A and 19B each illustrate one embodiment of the present invention.
Figure 19B:
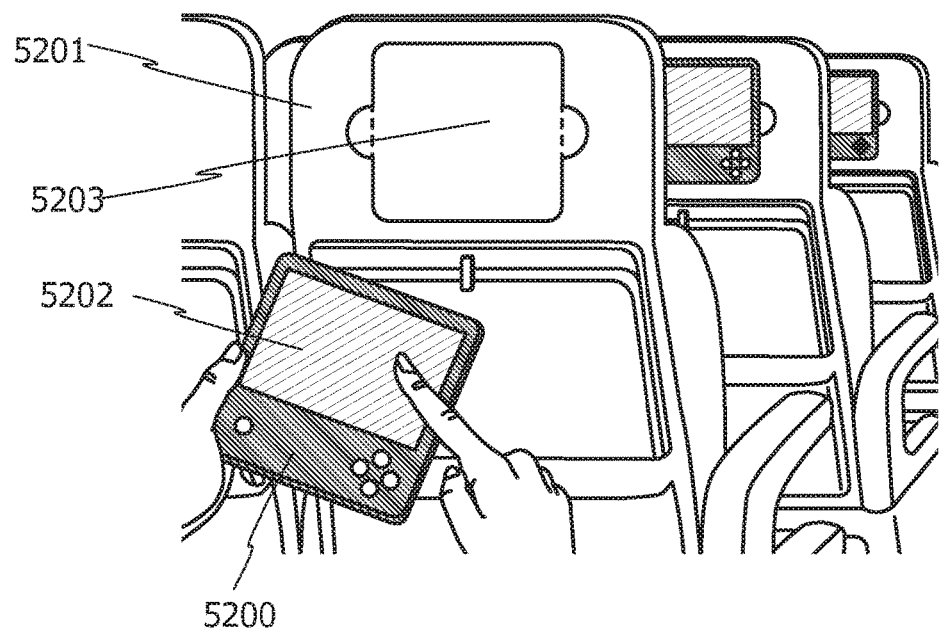

Usage examples of electronic devices are illustrated in FIGS. 19A and 19B.

FIG. 19A shows an example where an information terminal is operated in a moving object such as a car.

The numeral 5103 indicates a steering wheel, which includes an antenna inside. The antenna in the steering wheel 5103 can supply electric power to an electronic device 5100. The electronic device 5100 has a plurality of batteries, and at least one of the batteries is charged by wireless charging. The steering wheel 5103 may be provided with a jig that can fix the electronic device 5100. If the electronic device 5100 is fixed on the steering wheel 5103, the user can make a phone call or a video-phone call without using his/her hands. Furthermore, through voice authentication with the use of a microphone provided in the electronic device 5100, the car can be driven by a voice of the driver.

For example, by operating the electronic device 5100 while the car is parked, the positional information can be displayed on a display portion 5102. Furthermore, information not displayed on a display portion 5101 of the car, such as engine speed, steering wheel angle, temperature, and tire pressure may be displayed on the display portion 5102. The display portion 5102 has a touch input function. Furthermore, one or more cameras to image the outside of the car can be used to display the outside image on the display portion 5102. That is, the display portion 5102 can be used as a back monitor, for example. Furthermore, for preventing drowsy driving, the electronic device 5100 may operate as follows, for example: while wirelessly receiving information such as the driving speed from the car to monitor the driving speed, the electronic device 5100 images the driver at the time of driving and when a period for which the driver closes his/her eyes is long, it vibrates, beeps, or plays music (depending on the setting that can be selected by the driver as appropriate). Furthermore, by stopping imaging the driver while the car is parked, power consumption can be reduced. In addition, the batteries of the electronic device 5100 may be wirelessly charged while the car is parked.

The electronic device 5100 is expected to be used in a variety of ways in a moving object such as a car, as described above, and is desired to incorporate a number of sensors and a plurality of antennas that enable various functions thereof. Although a moving object such as a car has a power supply, the power supply is limited. In view of the electric power to drive the moving object, it is preferable that the electric power used for the electronic device 5100 be as low as possible. For an electric vehicle, in particular, power consumed by the electronic device 5100 may decrease the travel distance. Even if the electronic device 5100 has a variety of functions, it is not often that all the functions are used at a time, and only one or two functions are usually used as necessary. In the case where the electronic device 5100 including a plurality of batteries, each of which is prepared for a different function, has a variety of functions, only the function to be used is turned on and electric power is supplied thereto from a battery corresponding to that function; whereby, power consumption can be reduced. Furthermore, batteries corresponding to the functions not in use, among the plurality of batteries, can be wirelessly charged from an antenna provided in the car.

FIG. 19B illustrates an example in which an information terminal is operated in an airplane or the like. Since a period in which an individual can use his/her own information terminal is limited in an airplane or the like, the airplane is desired to be equipped with information terminals that the passengers can use when the flight is long.

An electronic device 5200, having a display portion 5202 that displays images such as a movie, a game, and a commercial, is an information terminal with which the current flying location and the remaining flight time can be obtained in real time, owing to its communication function. The display portion 5202 has a touch input function.

The electronic device 5200 can be fit into a depressed portion in a seat 5201, and an antenna installation portion 5203 is provided in a position that overlaps with the electronic device 5200, whereby the electronic device 5200 can be wirelessly charged while it is fit into the depressed portion. Furthermore, the electronic device 5200 can function as a telephone or communication tool when the user is sick and wants to contact a flight attendant, for example. If the electronic device 5200 has a translation function, the user can communicate with a flight attendant by using the display portion 5202 of the electronic device 5200 even when the user and the flight attendant speak different languages. Furthermore, passengers seated next to one another who speak different languages can communicate by using the display portion 5202 of the electronic device 5200. In addition, the electronic device 5200 can function as a message board, displaying a message in English such as "please do not disturb" on the display portion 5202 while the user is asleep, for example.

The electronic device 5200 has a plurality of batteries each of which is for a different function, and only the function to be used is turned on while the other functions not in use are in an off state, whereby power consumption can be reduced. Furthermore, among the plurality of batteries, batteries corresponding to the functions not in operation can be wirelessly charged from the antenna installation portion 5203.

The carriage of dangerous goods by air is regulated. The electronic device 5200 having a plurality of small-sized batteries is highly safe, and even if one of the batteries explodes, only a minor fire in the housing is caused and damage can be almost prevented. In addition, even if one battery becomes unavailable because of failure, explosion, or breakage, some of the functions of the electronic device 5200 can still be used by utilizing the other batteries.

The plurality of batteries of the electronic device 5200 provided over the plurality of seats may be designed such that they can be used in emergency when an airplane has an electrical problem. Since all the electronic devices 5200, each of which is provided for each of the plurality of seats, are the same products having the same design, a system may be constructed such that the electronic devices 5200 can be connected in series as an emergency power supply.

As the plurality of small-sized batteries of the electronic device 5200, one or more kinds selected from the following can be used: a lithium ion secondary battery such as a lithium polymer battery, a lithium ion capacitor, an electric double layer capacitor, and a redox capacitor.

The structure described in this embodiment can be used in appropriate combination with the structure described in any of the other embodiments.

Embodiment 8

In this embodiment, an example of an artificial organ that is one embodiment of the present invention will be described.

Figure 20:
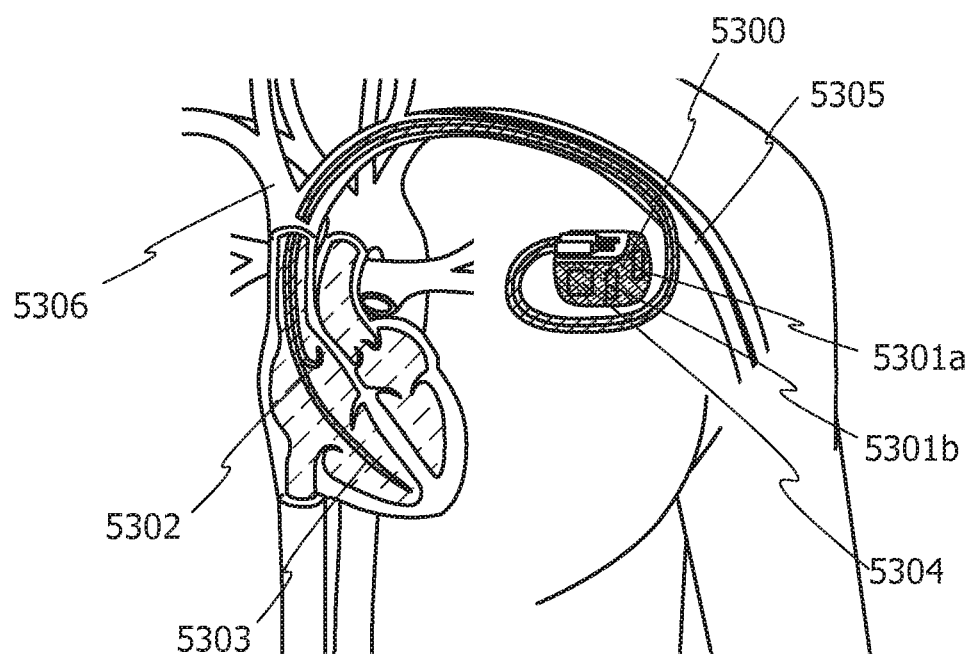
FIG. 20 illustrates one embodiment of the present invention.

FIG. 20 is a cross-sectional schematic view of an example of a pacemaker.

A pacemaker body 5300 includes at least batteries 5301a and 5301b, a regulator, a control circuit, an antenna 5304, a wire 5302 reaching a right atrium, and a wire 5303 reaching a right ventricle.

The pacemaker body 5300 is implanted in the body by surgery, and the two wires pass through a subclavian vein 5305 and a superior vena cava 5306 of the human body, with the end of one of them placed in the right ventricle and the end of the other of them placed in the right atrium.

The antenna 5304 can receive electric power, and the plurality of batteries 5301a and 5301b are charged with the electric power, which can reduce the frequency of replacing the pacemaker. Since the pacemaker body 5300 has a plurality of batteries, the safety is high, and even when one of the batteries fails, the other can function. In this manner, the plurality of batteries function as auxiliary power supplies. Furthermore, if the battery to be provided in the pacemaker is further divided into a plurality of thin batteries to be mounted on a printed board where control circuits including a CPU and the like are provided, the pacemaker body 5300 can be smaller in size and thickness.

In addition to the antenna 5304 that can receive electric power, an antenna that can transmit a physiological signal may be provided for the pacemaker. For example, a system that monitors the cardiac activity, capable of monitoring physiological signals such as pulses, respiratory rate, heart rate, and body temperature with an external monitoring device may be constructed.

If the pacemaker can be small in size and thickness according to this embodiment, a protrusion generated in the portion where the pacemaker body 5300 is implanted can be unnoticeably small.

Note that how the pacemaker is placed here is just an example, and it can be changed in various ways depending on the heart disease.

Furthermore, this embodiment is not limited to the pacemaker. An artificial ear is an artificial organ that is more widely used than the pacemaker. An artificial ear converts a sound into an electric signal and directly stimulates the auditory nerve with a stimulus device in the cochlea.

An artificial ear includes a first device implanted deep in the ear by surgery and a second device that picks up sounds with a microphone and sends them to the implanted first device. The first device and the second device are not electrically connected to each other, and transmission and reception between the two are conducted wirelessly. The first device includes at least an antenna that receives an electric signal converted from a sound and a wire that reaches the cochlea. The second device includes at least a sound processing portion for converting a sound into an electric signal and a transmitting circuit that transmits the electric signal to the first device.

In this embodiment, a small-sized battery is provided in each of the first device and the second device, whereby the artificial ear can be reduced in size.

Since artificial ears are often implanted by surgery in childhood, reduction in size is desired.

If reduction in size of an artificial ear is achieved by this embodiment, a protrusion generated in the portion where the artificial ear is implanted can be unnoticeably small.

The structure described in this embodiment can be used in appropriate combination with the structure described in any of the other embodiments.

Embodiment 9

In this embodiment, an example of a wearable electronic device that is one embodiment of the present invention will be described.

Figure 21A:
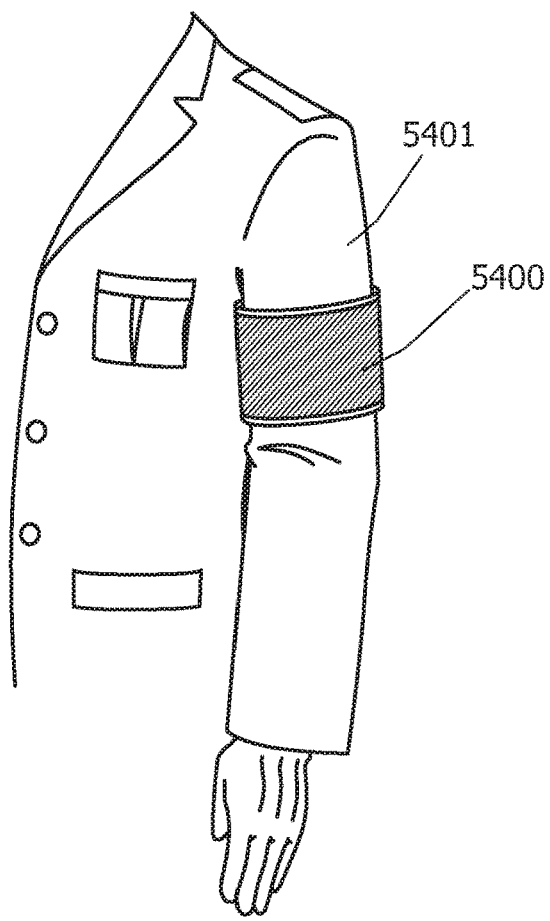
FIGS. 21A and 21B illustrate one embodiment of the present invention.

In the case where an electronic device with a complex shape is manufactured, a plurality of small-sized batteries are placed in predetermined places as appropriate, whereby the degree of freedom in design of the electronic device can be increased. As shown in FIG. 21A, an electronic device 5400 has a cylindrical form. In order for the electronic device 5400 to be worn on the human body, a plurality of batteries rather than a single battery are appropriately placed, whereby a feeling of the weight can be reduced. Furthermore, if the device has a number of functions, consumption of a battery in a standby state increases; therefore, batteries for the respective functions are prepared. In the case where the electronic device 5400 having a plurality of batteries has a variety of functions, only the function to be used is turned on and electric power is supplied from the battery corresponding to the function, whereby power consumption can be reduced.

The electronic device 5400 is worn on the left upper arm, over a clothes 5401, as shown in FIG. 21A. Examples of the clothes 5401 include clothes with sleeves, such as a military uniform, an assault jacket, a suit jacket, a uniform, and space suits. There is no particular limitation on how to wear the electronic device 5400, and examples of ways to wear it include sewing it on a portion of clothes that overlaps with the upper arm, attaching it with a Velcro fastener (registered trademark) or the like provided on a portion of clothes that overlaps with the upper arm, fixing it with a band, a clasp, or the like, and binding a band-like leaf spring around an upper arm.

Figure 21B:
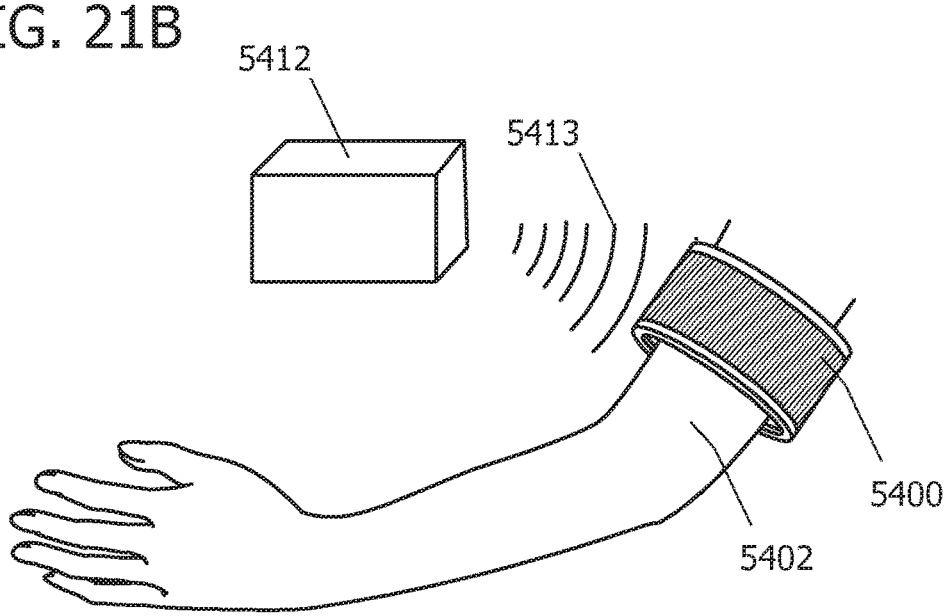

The electronic device 5400 has an antenna. A perspective view in which the electronic device 5400 is worn on the skin and wirelessly charged is shown in FIG. 21B. In FIG. 21B, the electronic device 5400 is worn on an upper arm 5402. A surface of the electronic device 5400 that is to be in contact with the skin is preferably formed using a skin-friendly film or a natural material such as leather, paper, and fabric. The numeral 5412 indicates an electric power transmission device that can wirelessly charge the electronic device 5400 with the use of a radio wave 5413. When provided with an antenna or a circuit that can transmit and receive other data, the electronic device 5400 can transmit and receive other data as well as power. For example, the novel device can also be used like a smartphone.

The structure described in this embodiment can be used in appropriate combination with the structure described in any of the other embodiments.

Embodiment 10

In this embodiment, an example of an electronic device that can be applied to one embodiment of the present invention is described with reference to FIGS. 22A to 22C.

Figure 22A:
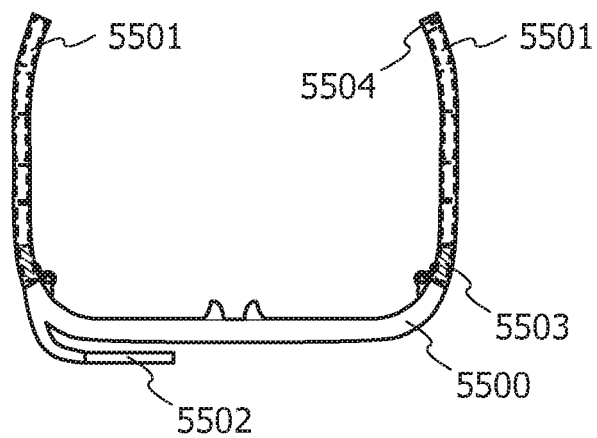
FIGS. 22A to 22C illustrate one embodiment of the present invention.
Figure 22B:
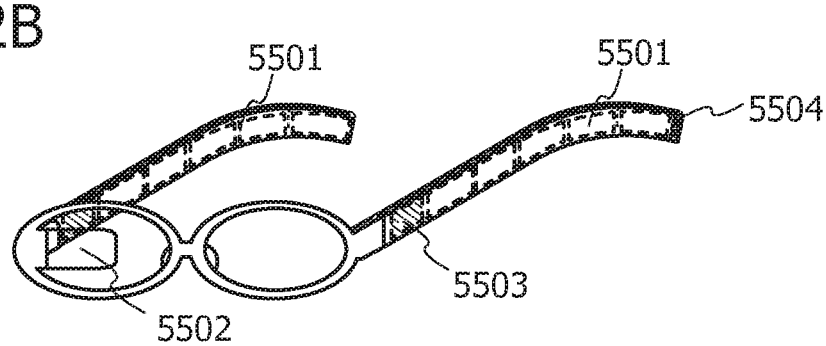

FIG. 22A is a top view of a glasses-type device 5500, and FIG. 22B is a perspective view thereof.

The glasses-type device 5500 includes a portion that is positioned along each side of the head of the user when the device is worn (hereinafter referred to as temples), and a plurality of secondary batteries 5501 are provided in each of the right and left temples.

In addition, the glasses-type device 5500 may include a terminal portion 5504. The secondary batteries 5501 can be charged through the terminal portion 5504. Furthermore, the secondary batteries 5501 are preferably electrically connected to each other. When the secondary batteries 5501 are electrically connected to each other, all the secondary batteries 5501 can be charged through the one terminal portion 5504.

In addition, the glasses-type device 5500 may include a display portion 5502. Further, the glasses-type device may include a control portion 5503. The control portion 5503 can control charge and discharge of the secondary batteries 5501 and can generate image data which is displayed on the display portion 5502. Moreover, if a chip having a wireless communication function is included in the control portion 5503, data can be transmitted to and received from the outside.

Figure 22C:
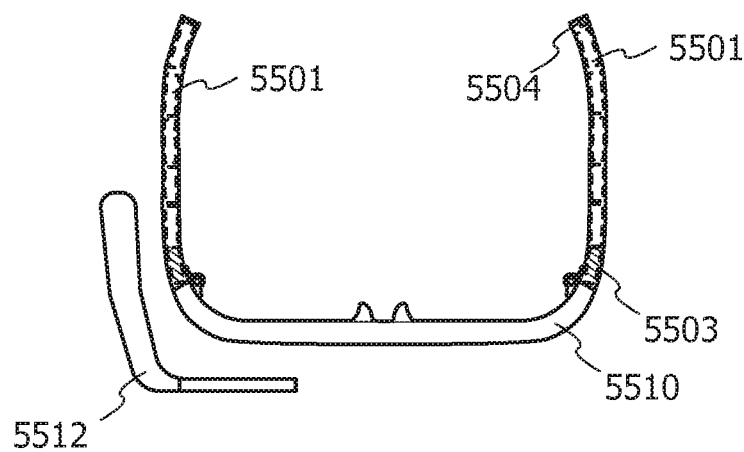

As illustrated in a top view of FIG. 22C, a glasses-type device 5510, which does not include the display portion 5502, may be provided. An external display portion 5512 may be attached to the glasses-type device 5510. Thus, the distance between the eyes of the user and the display portion 5512 can be easily adjusted.

Between the glasses-type device 5510 and the external display portion 5512, wireless communication and wireless power feeding may be performed.

The structure described in this embodiment can be used in appropriate combination with the structure described in any of the other embodiments.

This application is based on Japanese Patent Application serial no. 2014-162476 filed with the Japan Patent Office on Aug. 8, 2014, the entire contents of which are hereby incorporated by reference.

What is claimed is:

1. A semiconductor device comprising:
a voltage generation circuit;
a battery electrically connected to the voltage generation circuit; and
a transistor comprising a gate and a back gate, the back gate being electrically connected to the battery and the voltage generation circuit,
wherein the battery comprises a solid electrolyte,
wherein the voltage generation circuit is configured to generate a potential for charging the battery, and
wherein the battery is configured to apply the potential to the back gate of the transistor.

2. The semiconductor device according to claim 1, wherein the transistor comprises an oxide semiconductor layer which comprises indium, gallium, and zinc.

3. The semiconductor device according to claim 1, wherein the voltage generation circuit comprises a capacitor, a first diode, and a second diode.

4. The semiconductor device according to claim 3,
wherein one electrode of the first diode, one electrode of the second diode, and one electrode of the capacitor are electrically connected to each other, and
wherein the other electrode of the second diode is electrically connected to one terminal of the battery.

5. A semiconductor device comprising:
a voltage generation circuit comprising an oscillator circuit;
a battery electrically connected to the voltage generation circuit; and
a transistor comprising a gate and a back gate, the back gate being electrically connected to the battery and the voltage generation circuit,
wherein the battery comprises a solid electrolyte,
wherein the voltage generation circuit is configured to generate a potential for charging the battery, the potential being oscillated by the oscillator circuit, and
wherein the battery is configured to apply the potential to the back gate of the transistor.

6. The semiconductor device according to claim 5, wherein the transistor comprises an oxide semiconductor layer which comprises indium, gallium, and zinc.

7. The semiconductor device according to claim 5, wherein the voltage generation circuit comprises a capacitor, a first diode, and a second diode.

8. The semiconductor device according to claim 7,
wherein one electrode of the first diode, one electrode of the second diode, and one electrode of the capacitor are electrically connected to each other, and
wherein the other electrode of the second diode is electrically connected to one terminal of the battery.

9. The semiconductor device according to claim 5, wherein the oscillator circuit comprises a first inverter, a second inverter, and a NOR.

10. A semiconductor device comprising:
a voltage generation circuit comprising an oscillator circuit;
a battery electrically connected to the voltage generation circuit; and
a transistor comprising a gate and a back gate, the back gate being electrically connected to the battery and the voltage generation circuit,
wherein the battery comprises a solid electrolyte,
wherein the battery is stacked over the transistor,
wherein the voltage generation circuit is configured to generate a potential for charging the battery, the potential being oscillated by the oscillator circuit, and
wherein the battery is configured to apply the potential to the back gate of the transistor.

11. The semiconductor device according to claim 10, wherein the transistor comprises an oxide semiconductor layer which comprises indium, gallium, and zinc.

12. The semiconductor device according to claim 10, wherein the voltage generation circuit comprises a capacitor, a first diode, and a second diode.

13. The semiconductor device according to claim 12,
wherein one electrode of the first diode, one electrode of the second diode, and one electrode of the capacitor are electrically connected to each other, and
wherein the other electrode of the second diode is electrically connected to one terminal of the battery.

14. The semiconductor device according to claim 10, wherein the oscillator circuit comprises a first inverter, a second inverter, and a NOR.

15. The semiconductor device according to claim 10, wherein the battery is electrically connected to the back gate of the transistor through a plug in an insulating film including a halogen element.

* * * * *